United States Patent
Lee et al.

(10) Patent No.: US 10,064,294 B2
(45) Date of Patent: *Aug. 28, 2018

(54) DISPLAY DEVICE HAVING DISPLAY PANEL AND A CASE THAT COVERS AN EDGE OF THE DISPLAY PANEL

(71) Applicant: LG ELECTRONICS INC., Seoul (KR)

(72) Inventors: Jein Lee, Seoul (KR); Seunggyu Kang, Seoul (KR); Jaehun Lee, Seoul (KR); Hyuncheol Cho, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/352,742

(22) Filed: Nov. 16, 2016

(65) Prior Publication Data

US 2017/0071065 A1 Mar. 9, 2017

Related U.S. Application Data

(63) Continuation of application No. 14/537,358, filed on Nov. 10, 2014, now Pat. No. 9,521,763.

(30) Foreign Application Priority Data

Jan. 22, 2014 (KR) ........................ 10-2014-0008003

(51) Int. Cl.
*H05K 5/00* (2006.01)
*H05K 5/02* (2006.01)
(Continued)

(52) U.S. Cl.
CPC ......... *H05K 5/0017* (2013.01); *G06F 1/1601* (2013.01); *H05K 5/0004* (2013.01);
(Continued)

(58) Field of Classification Search
CPC ...... H05K 5/0017; H05K 5/0004; H05K 5/02; H05K 5/0217; H05K 5/03; G06F 1/1601
See application file for complete search history.

(56) References Cited

U.S. PATENT DOCUMENTS 6,104,451 A 8/2000 Matsuoka et al.
6,181,390 B1 1/2001 Wang et al.
(Continued)

FOREIGN PATENT DOCUMENTS

CN 101833185 9/2010
CN 102692741 9/2012
(Continued)

OTHER PUBLICATIONS

U.S. Appl. No. 15/655,467, filed Jul. 20, 2017.
(Continued)

*Primary Examiner* — Hoa C Nguyen
*Assistant Examiner* — Keith Depew
(74) *Attorney, Agent, or Firm* — KED & Associates, LLP

(57) ABSTRACT

Provided is a display device which may include a display panel having a long side in a first direction, a short side in a second direction, and a thickness in a third direction, a back cabinet disposed in the rear of the display panel, and a case that covers an edge of a front surface of the display panel. The case may include a horizontal case that covers an edge of the front surface of the display panel on a long side of the display panel and a vertical case covering an edge of the front surface of the display panel on a short side of the display panel. The horizontal case and the vertical case may be coupled to each other in a region corresponding to a corner of the display panel, and the horizontal case and the vertical case may be formed of different materials.

20 Claims, 35 Drawing Sheets

(51) Int. Cl.
  *G06F 1/16* (2006.01)
  *H05K 5/03* (2006.01)
  *H04N 5/64* (2006.01)
  *G02F 1/1333* (2006.01)
  *F21V 8/00* (2006.01)

(52) U.S. Cl.
  CPC ............ *H05K 5/02* (2013.01); *H05K 5/0217* (2013.01); *H05K 5/03* (2013.01); *G02B 6/0091* (2013.01); *G02F 1/133308* (2013.01); *G02F 2001/13332* (2013.01); *G02F 2001/133314* (2013.01); *G02F 2001/133325* (2013.01); *G02F 2001/133328* (2013.01); *G02F 2201/46* (2013.01); *H04N 5/64* (2013.01)

(56) References Cited

U.S. PATENT DOCUMENTS

| | | | |
|---|---|---|---|
| 9,316,864 B2 | 4/2016 | Lee et al. | |
| 9,621,838 B2 | 4/2017 | Yokawa et al. | |
| 2005/0162583 A1* | 7/2005 | Ozolins | G02F 1/1333 349/58 |
| 2007/0090247 A1 | 4/2007 | Shi et al. | |
| 2007/0097330 A1* | 5/2007 | Park | G02F 1/133308 353/79 |
| 2007/0115401 A1 | 5/2007 | Tsubokura et al. | |
| 2007/0132905 A1 | 6/2007 | Kim et al. | |
| 2008/0030642 A1 | 2/2008 | Harayama | |
| 2008/0278896 A1 | 11/2008 | Kawano | |
| 2010/0296022 A1* | 11/2010 | Ando | G02F 1/133308 349/58 |
| 2010/0302457 A1 | 12/2010 | Yamamoto et al. | |
| 2012/0118628 A1 | 5/2012 | Pakula et al. | |
| 2013/0313017 A1* | 11/2013 | Zhu | H05K 5/02 174/520 |
| 2014/0063401 A1 | 3/2014 | Kuo et al. | |
| 2014/0063404 A1 | 3/2014 | Chen et al. | |
| 2014/0071374 A1 | 3/2014 | Huang | |
| 2014/0139778 A1 | 5/2014 | Wang et al. | |
| 2014/0160393 A1 | 6/2014 | Zhang et al. | |
| 2014/0176850 A1 | 6/2014 | Kim et al. | |
| 2014/0218656 A1 | 8/2014 | Maruno | |
| 2014/0254192 A1* | 9/2014 | Do | G02B 6/0051 362/606 |
| 2014/0333869 A1 | 11/2014 | Tang | |
| 2015/0015793 A1* | 1/2015 | Noguchi | H04N 5/64 348/725 |
| 2015/0373857 A1* | 12/2015 | Chikazawa | H04N 5/64 348/726 |

FOREIGN PATENT DOCUMENTS

| | | |
|---|---|---|
| CN | 102819131 | 12/2012 |
| CN | 103235427 | 8/2013 |
| EP | 1 783 583 | 5/2007 |
| EP | 2 256 539 | 12/2010 |
| WO | WO 2012/057551 | 5/2012 |
| WO | WO 2013/018398 | 2/2013 |
| WO | WO 2013/153941 | 10/2013 |

OTHER PUBLICATIONS

Chinese Office Action dated Jan. 23, 2017 issued in Application No. 201510007941.2 (English translation attached).
European Search Report dated Jun. 8, 2015 issued in Application No. 14194869.5.
U.S. Office Action dated Mar. 23, 2016 issued in co-pending U.S. Appl. No. 14/537,358.
U.S. Office Action dated Dec. 19, 2017 issued in co-pending U.S. Appl. No. 15/655,467.
European Search Report dated Jan. 3, 2018 issued in Application No. 17190750.4.
European Search Report dated Apr. 9, 2018 issued in Application No. 17190750.4.
U.S. Final Office Action dated Jul. 2, 2018 issued in co-pending U.S. Appl. No. 15/655,467.

* cited by examiner

DISPLAY DEVICE HAVING DISPLAY PANEL AND A CASE THAT COVERS AN EDGE OF THE DISPLAY PANEL

CROSS-REFERENCE TO RELATED APPLICATIONS

The present application is a Continuation of co-pending U.S. patent application Ser. No. 14/537,358 filed on Nov. 10, 2014, which claims priority under 35 U.S.C. § 119(a) to Korean Patent Application No. 10-2014-0008003, filed on Jan. 22, 2014, whose entire disclosures are hereby incorporated by reference.

BACKGROUND

1. Field

Embodiments of the disclosure relate to a display device.

2. Background

With the development of the information society, various demands for display devices have been increasing. Various display devices, such as liquid crystal displays (LCDs), plasma display panels (PDPs), electroluminescent displays (ELDs), and vacuum fluorescent displays (VFDs), have been recently studied and used to meet various demands for the display devices. Among the display devices, a liquid crystal display panel of the liquid crystal display includes a liquid crystal layer, and a thin film transistor (TFT) substrate and a color filter substrate which are positioned opposite each other with the liquid crystal layer interposed therebetween. The liquid crystal display panel displays an image using light provided by a backlight unit of the liquid crystal display. Display devices have various types of enclosures or cases. Display devices having improved cases that reduces unnecessary use of materials is desired.

BRIEF DESCRIPTION OF THE DRAWINGS

The embodiments will be described in detail with reference to the following drawings in which like reference numerals refer to like elements wherein.

DETAILED DESCRIPTION

Figure 1:
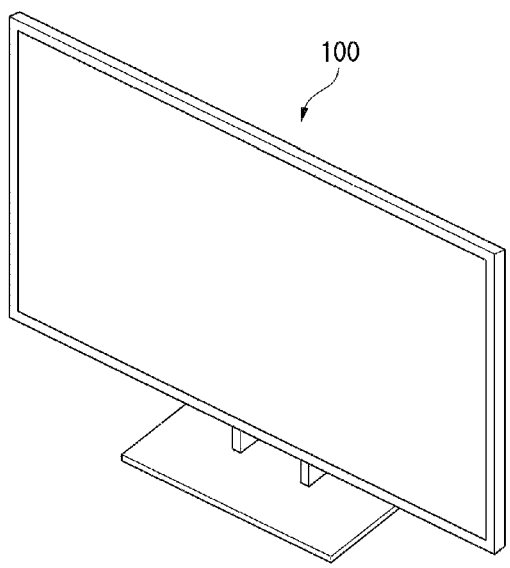
FIGS. 1 and 2 schematically illustrate configuration of a display device according to an exemplary embodiment of the disclosure.
Figure 1:
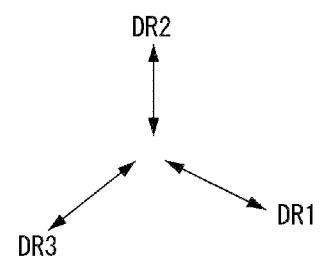

Reference will now be made in detail embodiments of the disclosure examples of which are illustrated in the accompanying drawings. Since the present disclosure may be modified in various ways and may have various forms, specific embodiments are illustrated in the drawings and are described in detail in the present specification. However, it should be understood that the present disclosure are not limited to specific disclosed embodiments, but include all modifications, equivalents and substitutes included within the spirit and technical scope of the present disclosure.

The terms 'first', 'second', etc. may be used to describe various components, but the components are not limited by such terms. The terms are used only for the purpose of distinguishing one component from other components. For example, a first component may be designated as a second component without departing from the scope of the present disclosure. In the same manner, the second component may be designated as the first component.

The term "and/or" encompasses both combinations of the plurality of related items disclosed and any item from among the plurality of related items disclosed.

When an arbitrary component is described as "being connected to "or" being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present disclosure. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present disclosure pertains. The terms defined in a generally used dictionary must be understood to have meanings identical to those used in the context of a related art, and are not to be construed to have ideal or excessively formal meanings unless they are obviously specified in the present application.

The following exemplary embodiments of the present disclosure are provided to those skilled in the art in order to describe the present disclosure more completely. Accordingly, shapes and sizes of elements shown in the drawings may be exaggerated for clarity.

Hereinafter, a liquid crystal display panel is used as an example of a display panel. Other display panels may be used. For example, a plasma display panel (PDP), a field emission display (FED) panel, and an organic light emitting display panel may be used.

In the following description, a first direction DR1 may be a direction parallel to long sides LS1 and LS2 of a display panel 420, and a second direction DR2 may be a direction parallel to short sides SS1 and SS2 of the display panel 420.

Further, a third direction DR3 may be a direction vertical to the first direction DR1 and/or the second direction DR2. The first direction DR1 and the second direction DR2 may be commonly referred to as a horizontal direction. Further, the third direction DR3 may be referred to as a vertical direction.

Figure 2:
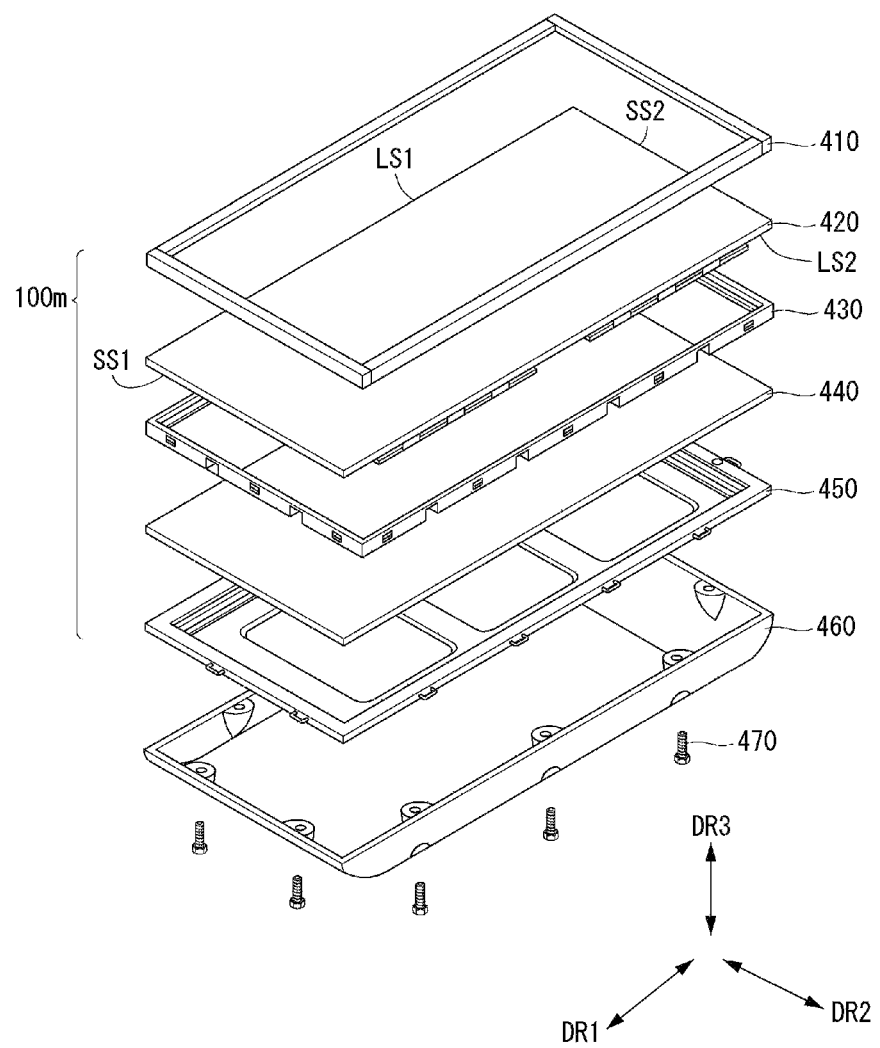

FIGS. 1 and 2 schematically illustrate configuration of a display device according to an exemplary embodiment of the disclosure. A display device 100 according to the embodiment of the disclosure may include a display panel 420, a top case 410, and a back cabinet 460. The top case 410 may also be referred to herein as a front case or a front cover. Moreover, the back cabinet 460 may also be referred to herein as a bottom cabinet or bottom cover.

The display panel 420 displaying an image may include a front substrate and a back substrate, which are positioned opposite each other. The top case 410 may cover an edge of a front surface of the display panel 420. More specifically, the display panel 420 may include a first long side LS1, a second long side LS2 opposite the first long side LS1, a first short side SS1 adjacent to the first long side LS1 and the second long side LS2, and a second short side SS2 opposite the first short side SS1. The top case 410 may cover the edge of the front surface of the display panel 420 on all of the first and second long sides LS1 and LS2 and the first and second short sides SS1 and SS2. The top case 410 may be divided into a plurality of parts. The top case 410 is described in detail below.

The back cabinet 460 may be disposed in the rear of the display panel 420 and may protect various parts positioned between the display panel 420 and the back cabinet 460. A back cover 450 may be disposed between the display panel 420 and the back cabinet 460. Various parts including a driving board (for example, a printed circuit board), light sources (not shown), etc. may be disposed on the back cover 450.

A light guide plate 440 may be disposed between the back cover 450 and the display panel 420. As described above, when the light guide plate 440 is disposed, an edge type backlight unit, in which the light sources are positioned on the side of the light guide plate 440, may be applied to the embodiment of the disclosure.

If the light guide plate 440 is omitted, a direct type backlight unit, in which the light sources are positioned under the display panel 420, may be applied to the embodiment of the disclosure. An optical layer (not shown) may be disposed between the light guide plate 440 and the display panel 420. A guide panel 430 may be disposed in the rear of the display panel 420. Moreover, a fastening member 470 may fasten the back cover 450 to the back cabinet 460.

The top case 410, the display panel 420, the guide panel 430, the light guide plate 440, and the back cover 450 (or bottom cover) may be included in a display module 100M. The display module 100M may further include the optical layer, the light sources, and the like.

FIGS. 3 to 16 illustrate the top case 410. In the following description, simply for ease of discussion, duplicative descriptions of the configuration and the structure described above may be briefly made or may be entirely omitted.

Figure 3:
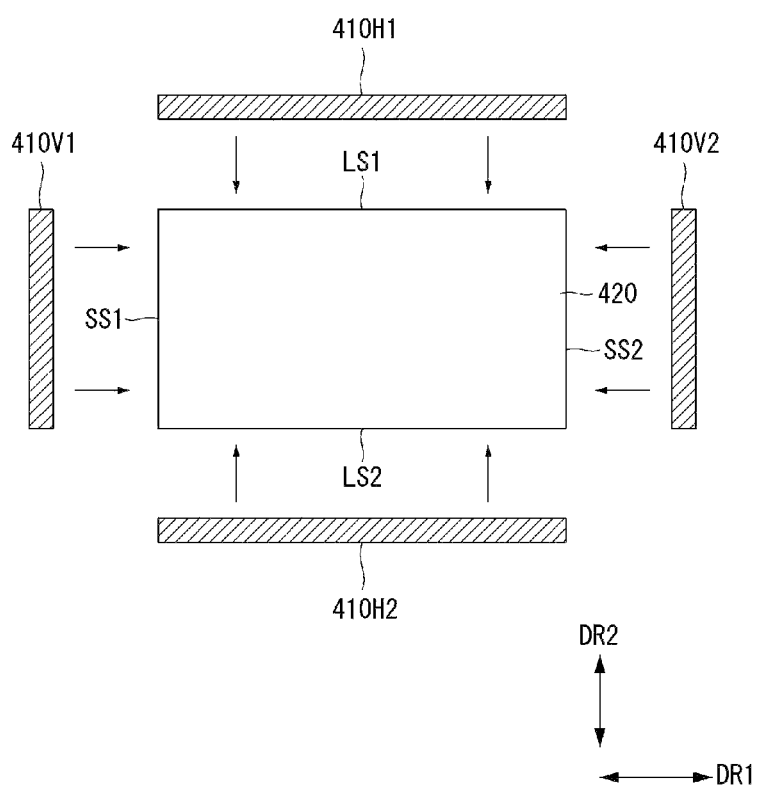
FIGS. 3 to 16 illustrate a front case.

As shown in FIG. 3, the top case 410 may include horizontal top cases 410H1 and 410H2 covering an edge of the front surface of the display panel 420 on the long sides LS1 and LS2 of the display panel 420 and vertical top cases 410V1 and 410V2 covering an edge of the front surface of the display panel 420 on the short sides SS1 and SS2 of the display panel 420.

The horizontal top cases 410H1 and 410H2 may include a first horizontal top case 410H1 corresponding to the first long side LS1 of the display panel 420 and a second horizontal top case 410H2 corresponding to the second long side LS2 of the display panel 420.

The vertical top cases 410V1 and 410V2 may include a first vertical top case 410V1 corresponding to the first short side SS1 of the display panel 420 and a second vertical top case 410V2 corresponding to the second short side SS2 of the display panel 420.

The horizontal top cases 410H1 and 410H2 and the vertical top cases 410V1 and 410V2 may be connected on the corner of the display panel 420. Namely, the first horizontal top case 410H1 and the first vertical top case 410V1 may be connected to each other on the corner of the first long side LS1 and the first short side SS1 of the display panel 420. The first horizontal top case 410H1 and the second vertical top case 410V2 may be connected to each other on the corner of the first long side LS1 and the second short side SS2 of the display panel 420. The second horizontal top case 410H2 and the first vertical top case 410V1 may be connected to each other on the corner of the second long side LS2 and the first short side SS1 of the display panel 420. The second horizontal top case 410H2 and the second vertical top case 410V2 may be connected to each other on the corner of the second long side LS2 and the second short side SS2 of the display panel 420.

Figure 4:
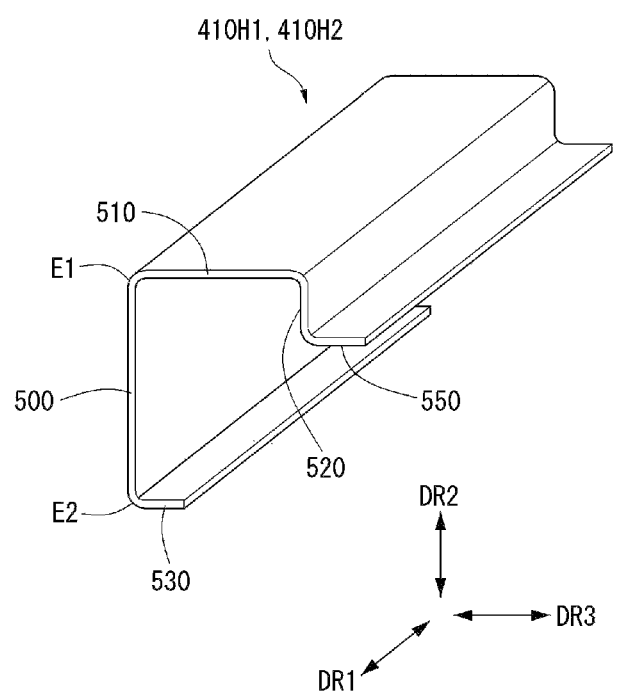

As shown in FIG. 4, each of the horizontal top cases 410H1 and 410H2 may include a first part 500, a second part 510 connected to the first part 500, and a third part 520 connected to the second part 510. In a cross section of the horizontal top cases 410H1 and 410H2, the first part 500 may extend in the second direction DR2 of the horizontal direction (i.e., the first direction DR1 and/or the second direction DR2) and may include a portion covering an edge of the front surface of the display panel 420 on the long sides LS1 and LS2 of the display panel 420.

The second part 510 may extend from a first end E1 of the first part 500 and may include a portion positioned on the side of the display panel 420 on the long sides LS1 and LS2 of the display panel 420. The third part 520 may extend from an end of the second part 510 in the second direction DR2 of the horizontal direction (i.e., the first direction DR1 and/or the second direction DR2).

Each of the horizontal top cases 410H1 and 410H2 may further include a fourth part 530 connected to the first part 500 and a sixth part 550 connected to the third part 520. The fourth part 530 may extend from a second end E2 opposite the first end E1 of the first part 500 in the vertical direction (i.e., the third direction DR3) and may be positioned on the front surface of the display panel 420 on the long sides LS1 and LS2 of the display panel 420. The sixth part 550 may extend from the third part 520 in the vertical direction (i.e., the third direction DR3).

Figure 5:
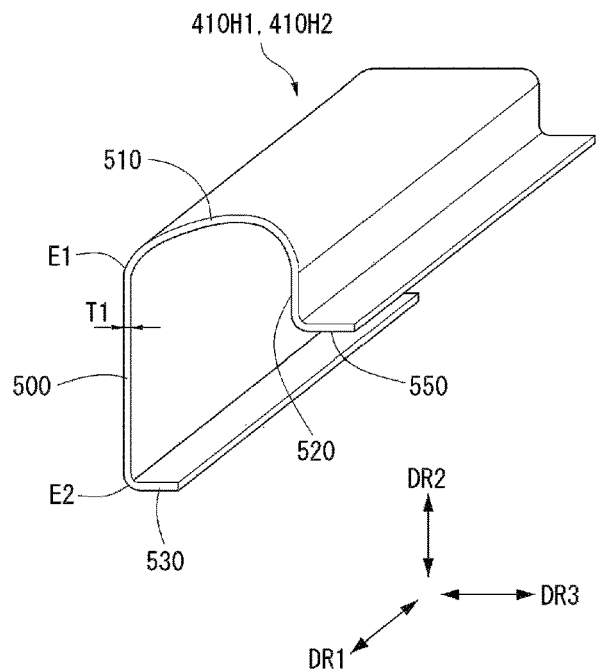

As shown in FIG. 5, the second part 510 may include a portion having a surface bending in an oblique direction. In this instance, the second part 510 may include a surface which extends from the first part 500 in the oblique direction and convexly bends. Moreover, each of the horizontal top cases 410H1 and 410H2 may have a first wall thickness T1.

Figure 6:
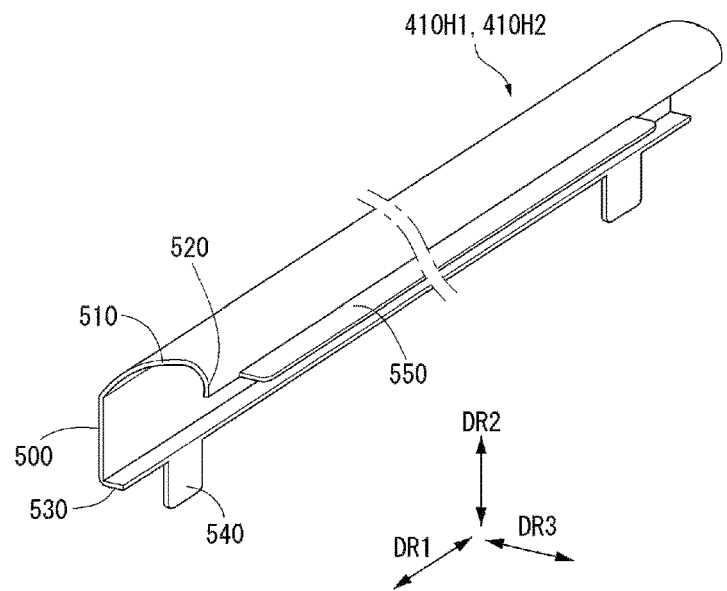

As shown in FIG. 6, each of the horizontal top cases 410H1 and 410H2 may further include a fifth part 540. The fifth part 540 may extend from the fourth part 530 in the second direction DR2 of the horizontal direction (i.e., the first direction DR1 and/or the second direction DR2). The fifth part 540 may be used to connect the horizontal top cases 410H1 and 410H2 with the vertical top cases 410V1 and 410V2. The fifth part 540 may have a variety of shapes and may be referred to herein as a tab or protrusion.

Figure 7:
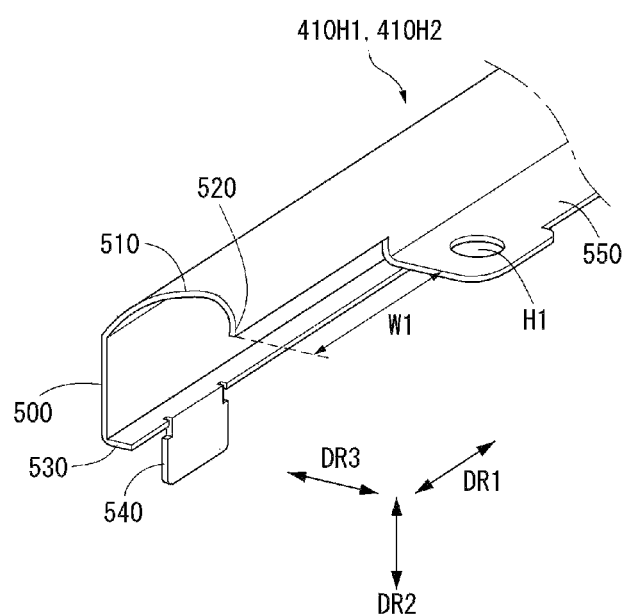

As shown in FIG. 7, the sixth part 550 of each of the horizontal top cases 410H1 and 410H2 may have a first hole H1 through which a fastening member passes. The first hole H1 may be used to connect the horizontal top cases 410H1 and 410H2 with another structure, for example, the vertical top cases 410V1 and 410V2 and/or the guide panel 430.

The sixth part 550 may be omitted in both end areas W1 of each of the horizontal top cases 410H1 and 410H2. That is, a length of the sixth part 550 in the first direction DR1 may be less than a length of the first part 500. As described above, when the sixth part 550 is omitted in the end areas W1 of the horizontal top cases 410H1 and 410H2, the horizontal top cases 410H1 and 410H2 and the vertical top cases 410V1 and 410V2 may be easily connected on the corners of the display panel 420.

As described above, the horizontal top case 410H1, 410H2 covers an edge on the front surface of the display panel. Here, the first part 500 may be referred to as a front surface, the second part 510 may be referred to as a lateral surface, and the third part 520 may be referred to as a rear surface. The fourth part 530 may be referred to as a flange. The fifth part 540 may be referred to as a tab, flange or protrusion. Moreover, the sixth part 550 may be referred to as a flange.

Figure 8:
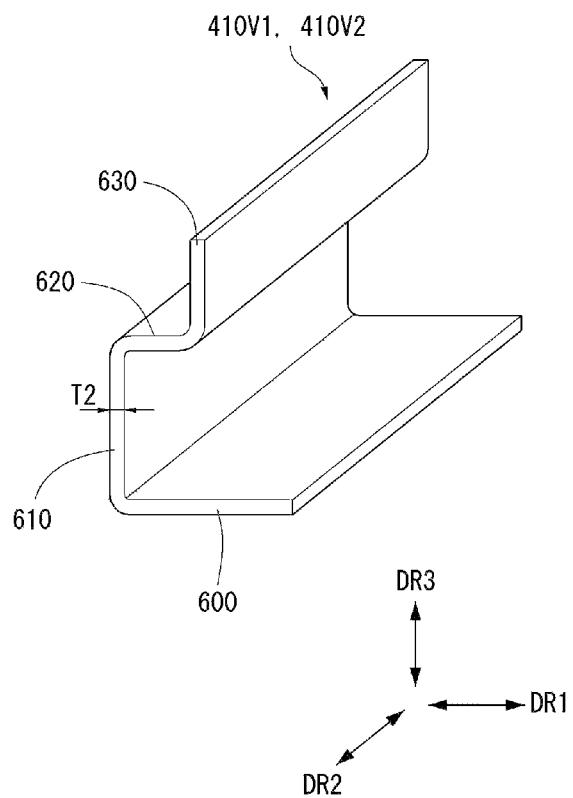

As shown in FIG. 8, each of the vertical top cases 410V1 and 410V2 may include a first part 600 (also referred to as a horizontal part) and a second part 610 (also referred to herein as a vertical part) connected to the first part 600. The first part 600 may be referred to as a front surface and the second part 610 may be referred to as a lateral surface of the vertical case.

The first part 600 may extend in the first direction DR1 of the horizontal direction (i.e., the first direction DR1 and/or the second direction DR2) and may include a portion covering an edge of the front surface of the display panel 420 on the short sides SS1 and SS2 of the display panel 420. The second part 610 may extend from the first part 600 and may include a portion positioned on the side of the display panel 420 on the short sides SS1 and SS2 of the display panel 420.

Each of the vertical top cases 410V1 and 410V2 may further include a first auxiliary part 620 extending from the second part 610 in the first direction DR1 of the horizontal direction (i.e., the first direction DR1 and/or the second direction DR2) and a second auxiliary part 630 extending from the first auxiliary part 620 in the vertical direction (i.e., the third direction DR3). Moreover, each of the vertical top cases 410V1 and 410V2 may have a second wall thickness T2.

Figure 9:
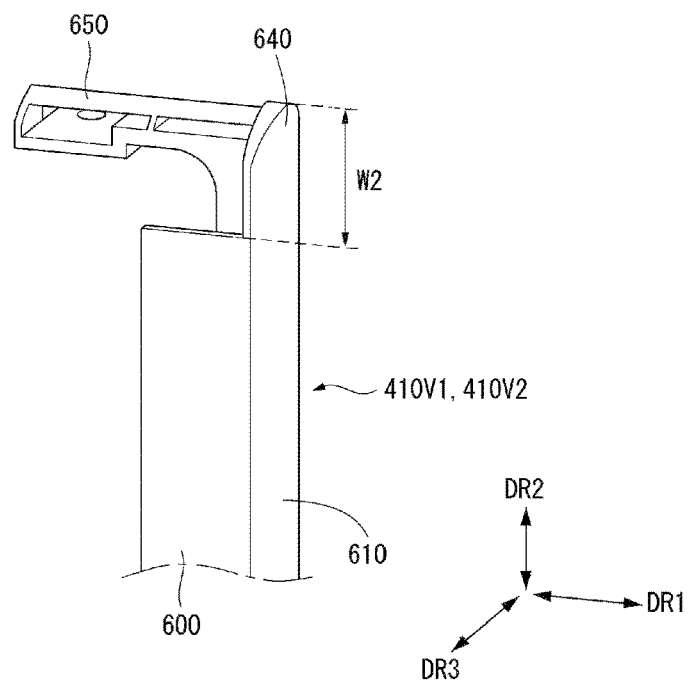

As shown in FIG. 9, the second part 610 of each of the vertical top cases 410V1 and 410V2 may include an extension 640 which extends further than the first part 600 by a predetermined height W2 in the second direction DR2 of the horizontal direction (i.e., the first direction DR1 and/or the second direction DR2). Each of the vertical top cases 410V1 and 410V2 may further include an overlap part 650 (also referred to herein as a protrusion) extending from the extension 640 in the first direction DR1 of the horizontal direction (i.e., the first direction DR1 and/or the second direction DR2).

Figure 10:
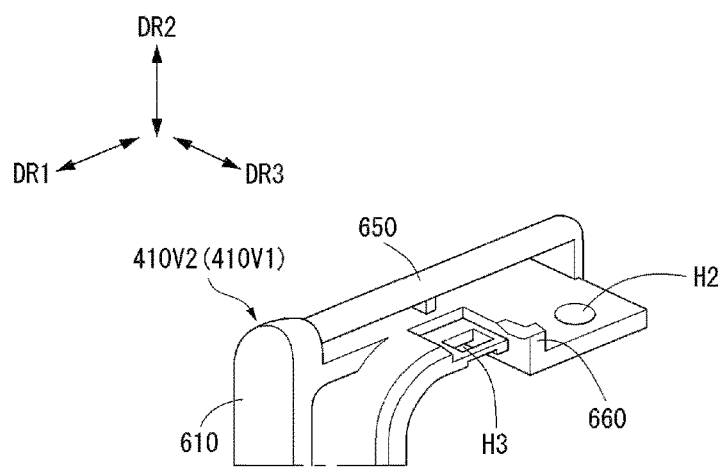

As shown in FIG. 10, the overlap part 650 may include a connection part 660 (also referred to herein as a tab) which extends in the vertical direction (i.e., the third direction DR3) and has a second hole H2. The second hole H2 may correspond to the first hole H1.

Figure 11:
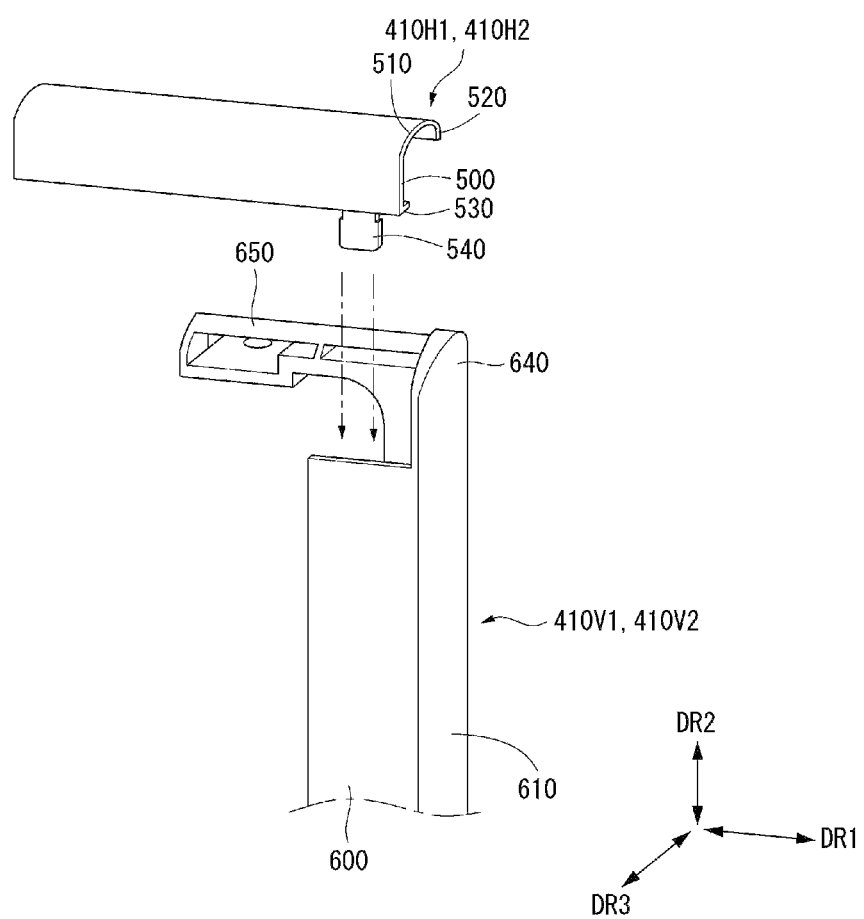

As shown in FIG. 11, the horizontal top cases 410H1 and 410H2 and the vertical top cases 410V1 and 410V2 may be connected on the corners of the display panel 420. The fifth part 540 of the horizontal top cases 410H1 and 410H2 may be inserted into a lower part of the first part 600 of the vertical top cases 410V1 and 410V2.

Figure 12:
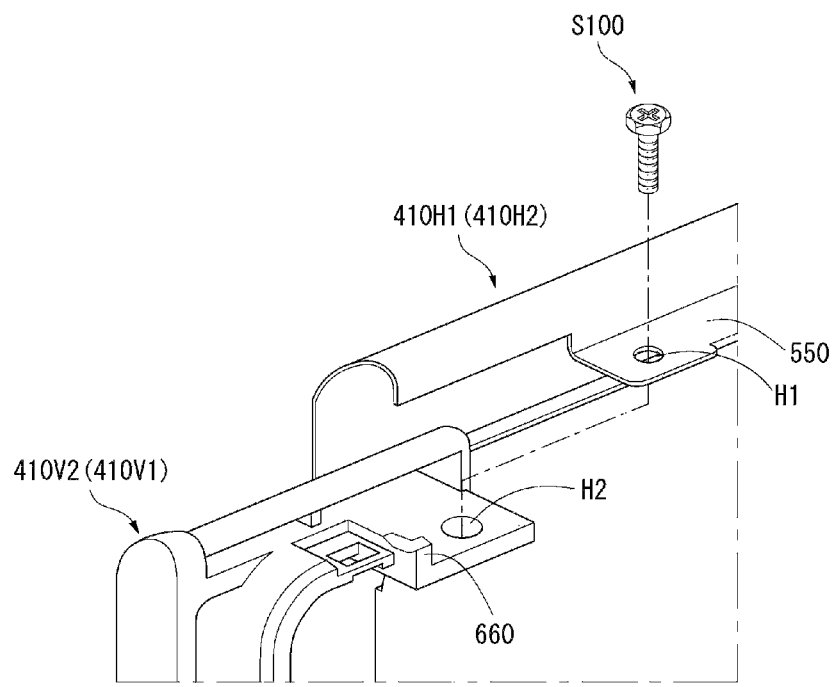

As shown in FIG. 12, a first fastening member S100, such as a screw, may pass through the first hole H1 and the second hole H2 and may connect the horizontal top cases 410H1 and 410H2 with the vertical top cases 410V1 and 410V2.

Figure 13:
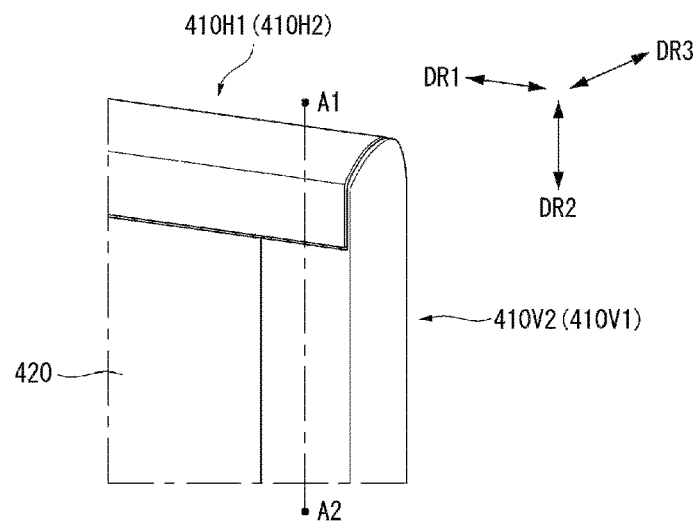

As shown in FIG. 13, when the horizontal top cases 410H1 and 410H2 and the vertical top cases 410V1 and 410V2 are connected, the fifth part 540 of the horizontal top cases 410H1 and 410H2 may be covered by the first part 600 of the vertical top cases 410V1 and 410V2. Further, the overlap part 650 of the vertical top cases 410V1 and 410V2 may be covered by the horizontal top cases 410H1 and 410H2.

Figure 14:
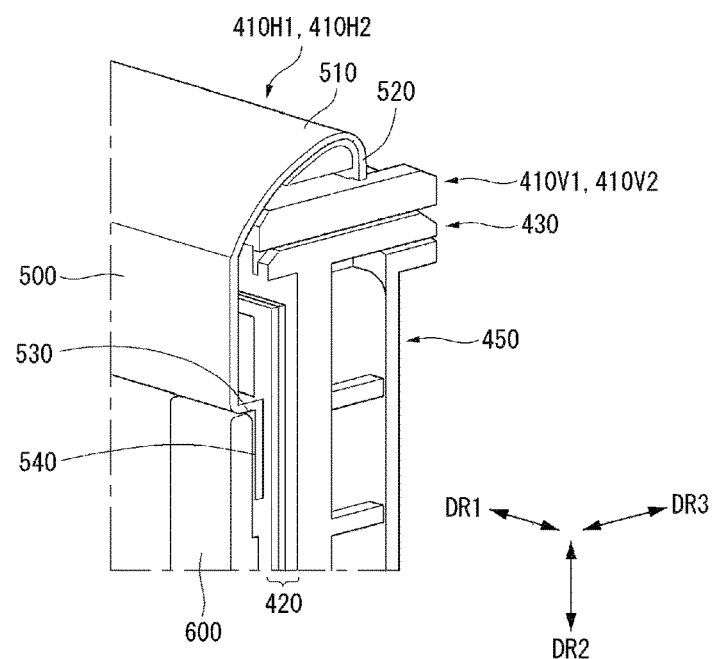

As shown in FIG. 14, the fifth part 540 of the horizontal top cases 410H1 and 410H2 may be inserted into a lower part of the first part 600 of the vertical top cases 410V1 and 410V2. Further, the horizontal top cases 410H1 and 410H2 may cover the edge of the front surface of the display panel 420 on the long sides LS1 and LS2 of the display panel 420, and the vertical top cases 410V1 and 410V2 may cover the edge of the front surface of the display panel 420 on the short sides SS1 and SS2 of the display panel 420.

The horizontal top cases 410H1 and 410H2 and the vertical top cases 410V1 and 410V2 may be aligned by the fifth parts 540 of the horizontal top cases 410H1 and 410H2 and the overlap parts 650 of the vertical top cases 410V1 and 410V2.

The first wall thickness T1 of the horizontal top cases 410H1 and 410H2 may be less than the second wall thickness T2 of the vertical top cases 410V1 and 410V2.

The horizontal top cases 410H1 and 410H2 and the vertical top cases 410V1 and 410V2 may be formed of different materials. Preferably, the horizontal top cases 410H1 and 410H2 may contain a metal material, and the vertical top cases 410V1 and 410V2 may contain a plastic material.

Figure 15:
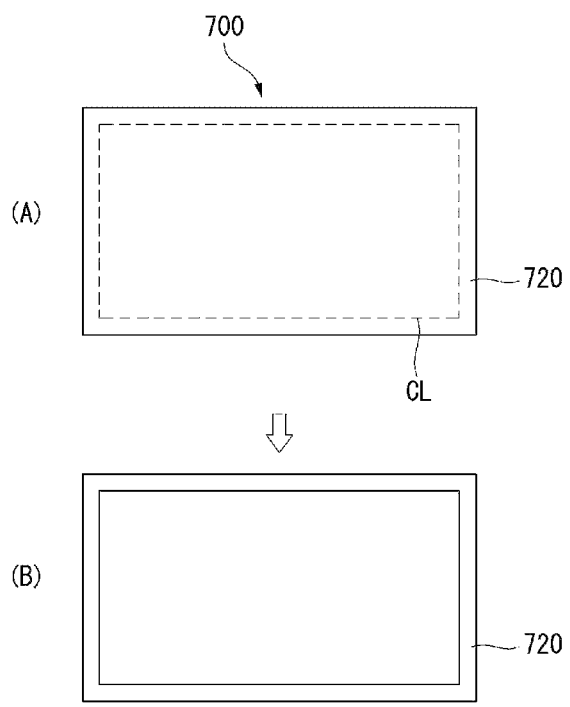

A reason to divide the top case 410 into the horizontal top cases 410H1 and 410H2 and the vertical top cases 410V1 and 410V2 formed of different materials is described below. As shown in FIG. 15, when the top case 410 is manufactured using only a metal material, a mother metal plate 700 may be processed through a press working method to manufacture a top case.

More specifically, as shown in (A) of FIG. 15, a middle portion 710 of the mother metal plate 700 may be removed along a predetermined cutting line CL in a press working process. Afterwards, as shown in (B) of FIG. 15, an outer portion 720 positioned outside the middle portion 710 of the mother metal plate 700 may be used as the top case. In this instance, because the middle portion 710 of the mother metal plate 700 is wasted, the manufacturing cost of the display device may increase due to the unnecessary waste of material.

On the other hand, when the horizontal top cases 410H1 and 410H2 are formed of a metal material and the vertical top cases 410V1 and 410V2 are formed of a plastic material as in the embodiment of the disclosure, the first horizontal top case 410H1, the second horizontal top case 410H2, the first vertical top case 410V1, and the second vertical top case 410V2 may be individually manufactured. Therefore, the unnecessary waste of material may be reduced. Hence, the manufacturing cost of the display device may be reduced.

Paint or tape may be applied to a surface of at least one of the first part 600 and the second part 610 of each of the vertical top cases 410V1 and 410V2, so as to match surface colors of the horizontal top cases 410H1 and 410H2 and the vertical top cases 410V1 and 410V2. For example, a silver paint or a silver tape may be applied to the surface of at least one of the first part 600 and the second part 610 of each of the vertical top cases 410V1 and 410V2, and thus the vertical top cases 410V1 and 410V2 may appear to have a metal surface that matches the horizontal top cases 410H1 and 410H2.

Figure 16:
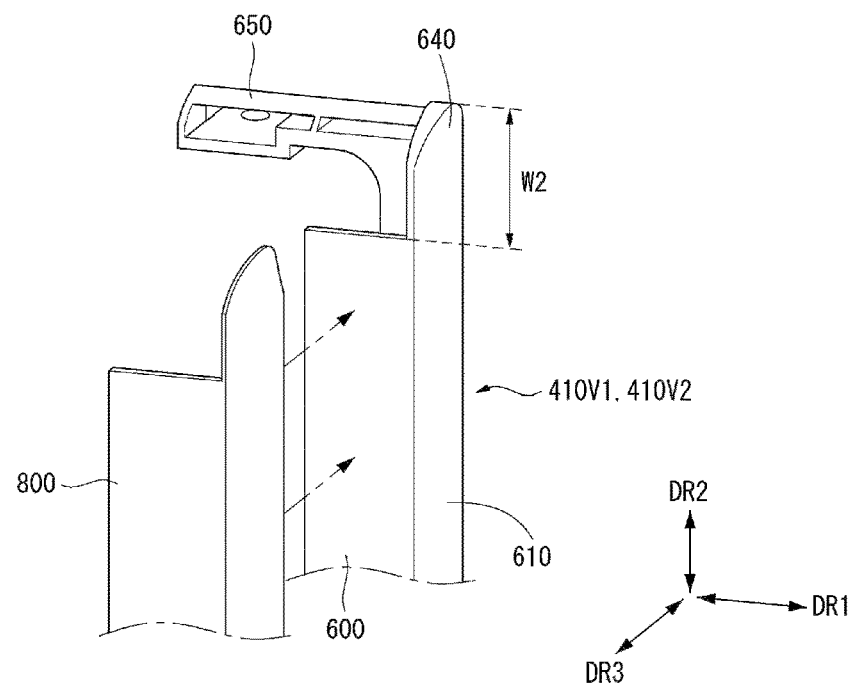

Alternatively, as shown in FIG. 16, a cover 800 containing a metal material may be disposed on the surface of at least one of the first part 600 and the second part 610 of each of the vertical top cases 410V1 and 410V2.

FIGS. 17 to 22 illustrate the guide panel. In the following description, the descriptions of the configuration and the structure described above may be briefly made or may be entirely omitted.

Figure 17:
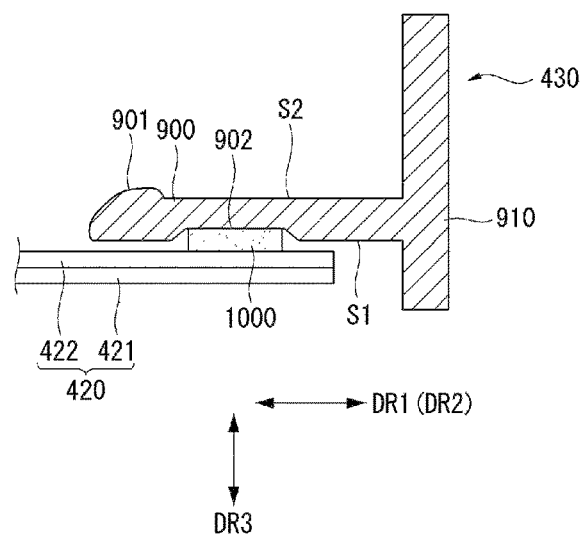
FIGS. 17 to 22 illustrate a guide panel.

As shown in FIG. 17, the guide panel 430 may include a base part 900 and a side wall 910 connected to the base part 900. The base part 900 may extend in the horizontal direction (i.e., the first direction DR1 and/or the second direction DR2). The base part 900 may be attached to a back surface of the display panel 420 through an adhesive layer 1000.

A groove 902, to which the adhesive layer 1000 is applied, may be formed on a bottom surface (i.e., a first surface S1) of the base part 900. A protrusion 901 protruding in the vertical direction (i.e., the third direction DR3) may be formed on an upper surface (i.e., a second surface S2) opposite the bottom surface S1 of the base part 900.

Figure 18:
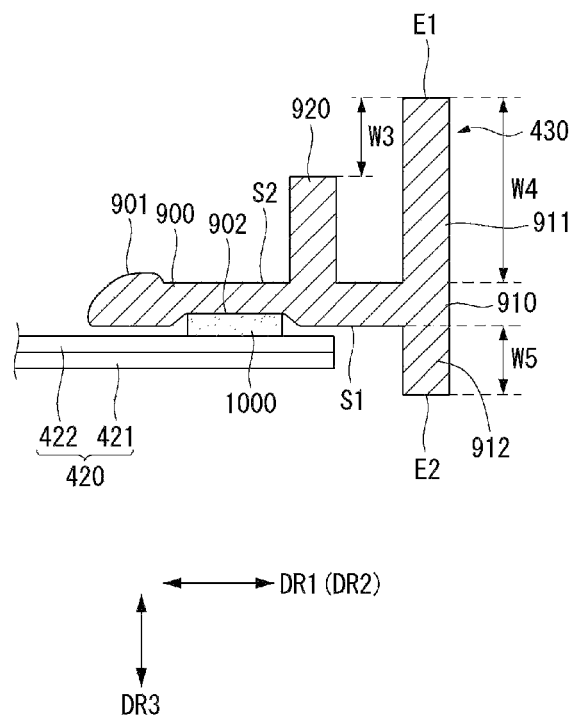

As shown in FIG. 18, the guide panel 430 may further include an inner wall 920. The inner wall 920 may be positioned between the side wall 910 and the protrusion 901. The inner wall 920 may extend from the upper surface S2 of the base part 900 in the vertical direction (i.e., the third direction DR3).

The side wall 910 may include a forward part 912 extending forward from the base part 900 in the vertical direction (i.e., the third direction DR3) and a backward part 911 extending backwards from the base part 900 in the vertical direction (i.e., the third direction DR3). A length W4 of the backward part 911 may be longer than a length W5 of the forward part 912. Further, the length W4 of the backward part 911 of the side wall 910 may be longer than a length of the inner wall 920 by a predetermined length W3.

A first end E1 of the side wall 910 is one end of the backward part 911, and a second end E2 of the side wall 910 is one end of the forward part 912. Further, the other end of the backward part 911 and the other end of the forward part 912 may be connected to each other.

Figure 19:
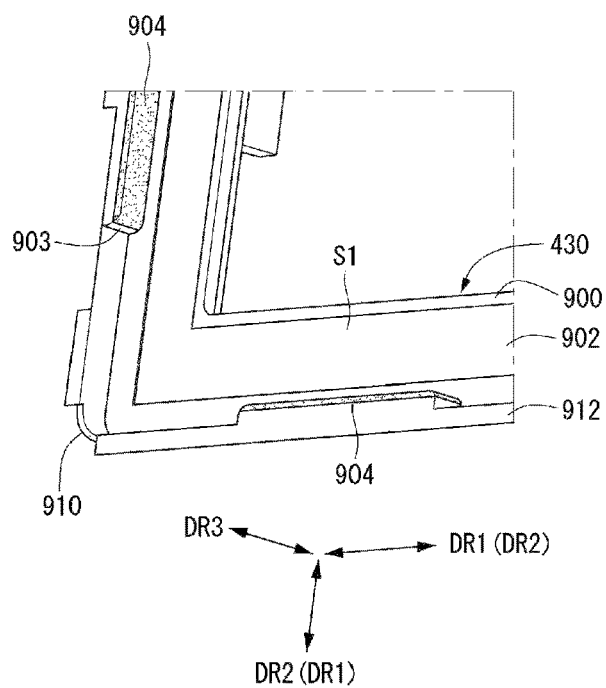

As shown in FIG. 19, the groove 902 is formed on the bottom surface S1 of the guide panel 430. The forward part 912 of the side wall 910 of the guide panel 430 may include a guide part 903 protruding in the horizontal direction (i.e., the first direction DR1 and/or the second direction DR2). The guide part 903 may prevent the side of the display panel 420 from colliding with the forward part 912 of the side wall 910.

A buffer 904 with elasticity may be disposed between the guide part 903 and the side of the display panel 420. The buffer 904 may be formed of a material with elasticity, for example, a resin material.

Figure 20:
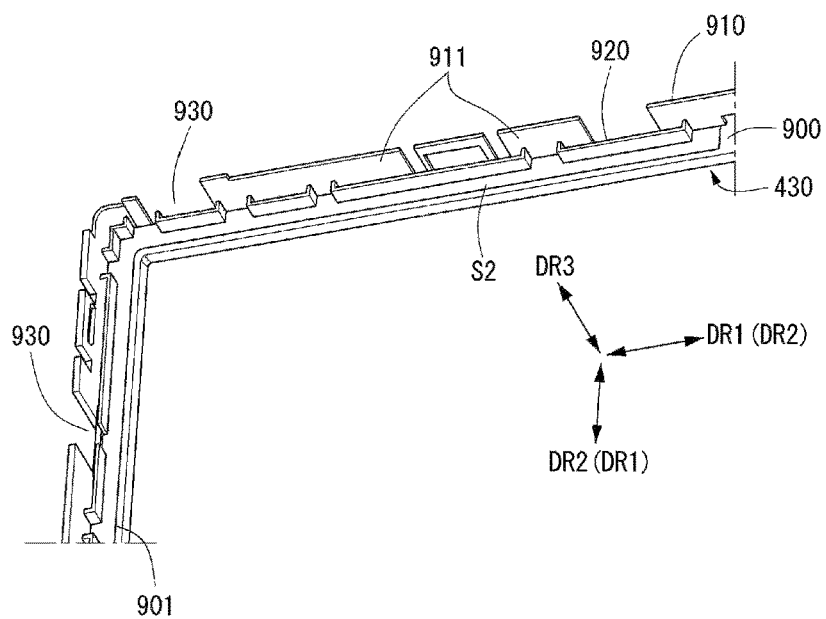

As shown in FIG. 20, the guide panel 430 may include a plurality of inner walls 920 which are positioned to be separated from one another in the horizontal direction (i.e., the first direction DR1 and/or the second direction DR2). The side wall 910 may be also divided into a plurality of parts. Namely, the plurality of side walls 910 may be positioned to be separated from one another in the horizontal direction (i.e., the first direction DR1 and/or the second direction DR2).

A space between the side walls 910 positioned adjacent in the horizontal direction (i.e., the first direction DR1 and/or the second direction DR2) may be referred to as a path 930. At least one path 930 may overlap the inner wall 920.

Figure 21:
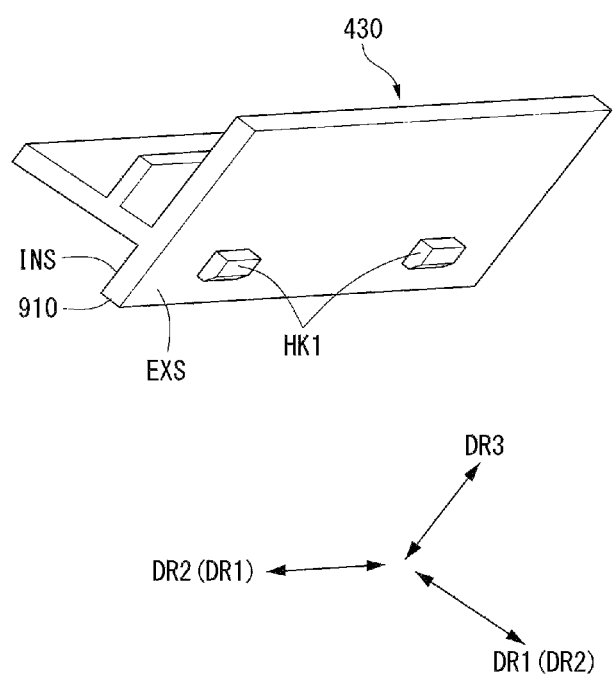
Figure 22:
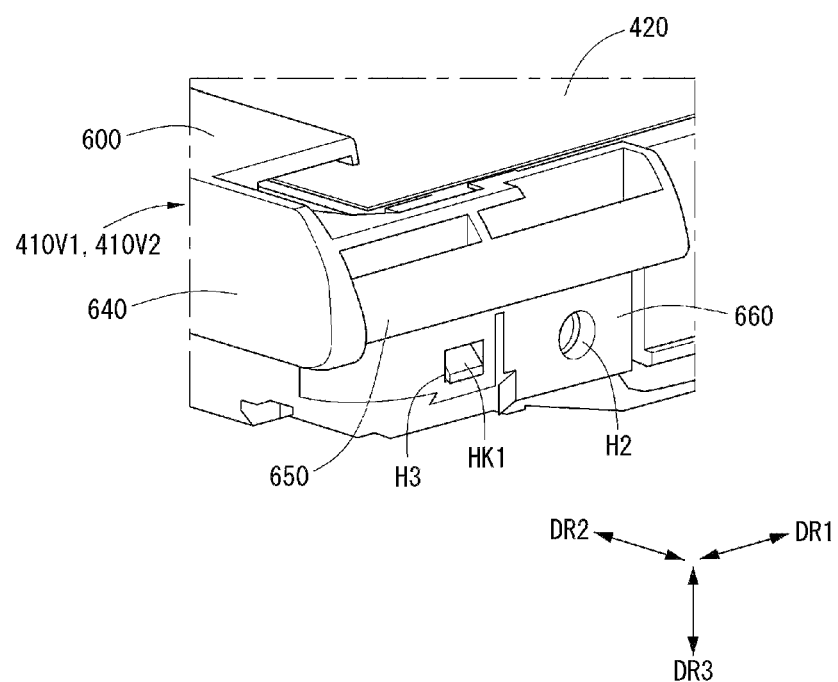

As shown in FIG. 21, the guide panel 430 may further include a first hook HK1 protruding from an external surface EXS of the side wall 910 in the horizontal direction (i.e., the first direction DR1 and/or the second direction DR2). The first hook HK1 may correspond to a predetermined hole of the top case 410. For example, as shown in FIG. 22, each of the vertical top cases 410V1 and 410V2 may have a third hole H3 corresponding to the first hook HK1.

FIGS. 23 to 46 illustrate in detail configuration of the display device according to the embodiment of the disclosure. In the following description, the descriptions of the configuration and the structure described above may be briefly made or may be entirely omitted.

Figure 23:
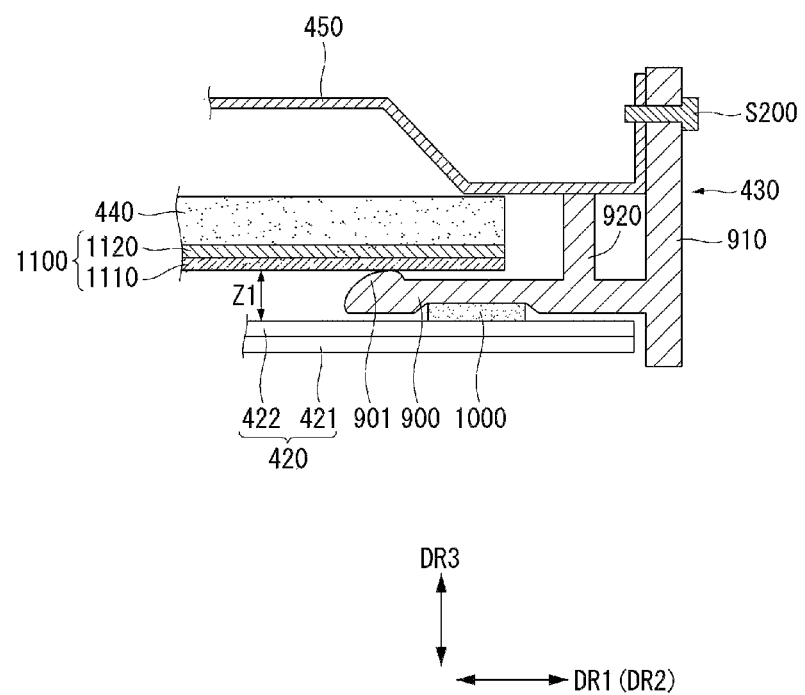
FIGS. 23 to 46 illustrate in detail configuration of a display device according to an exemplary embodiment of the disclosure.

As shown in FIG. 23, the display device 100 according to the embodiment of the disclosure may include an optical layer 1100 and the light guide plate 440. The optical layer 1100 may include a plurality of sheets. For example, the optical layer 1100 may include a diffusion sheet 1110 and a prism sheet 1120. The optical layer 1100 may be disposed on the base part 900 of the guide panel 430. More specifically, the optical layer 1100 may be disposed on the protrusion 901 of the base part 900 of the guide panel 430.

The protrusion 901 may reduce an area of a contact surface between the optical layer 1100 and the guide panel 430. An air gap of a predetermined width Z1 may be formed between the optical layer 1100 and the display panel 420 in the vertical direction (i.e., the third direction DR3).

The back cover 450 may be disposed in the rear of the optical layer 1100. The back cover 450 may be placed on the inner wall 920 of the guide panel 430. The back cover 450 may be connected to the side wall 910 of the guide panel 430 through a predetermined second fastening member S200. A method for connecting the back cover 450 with the guide panel 430 is not limited thereto.

Figure 24:
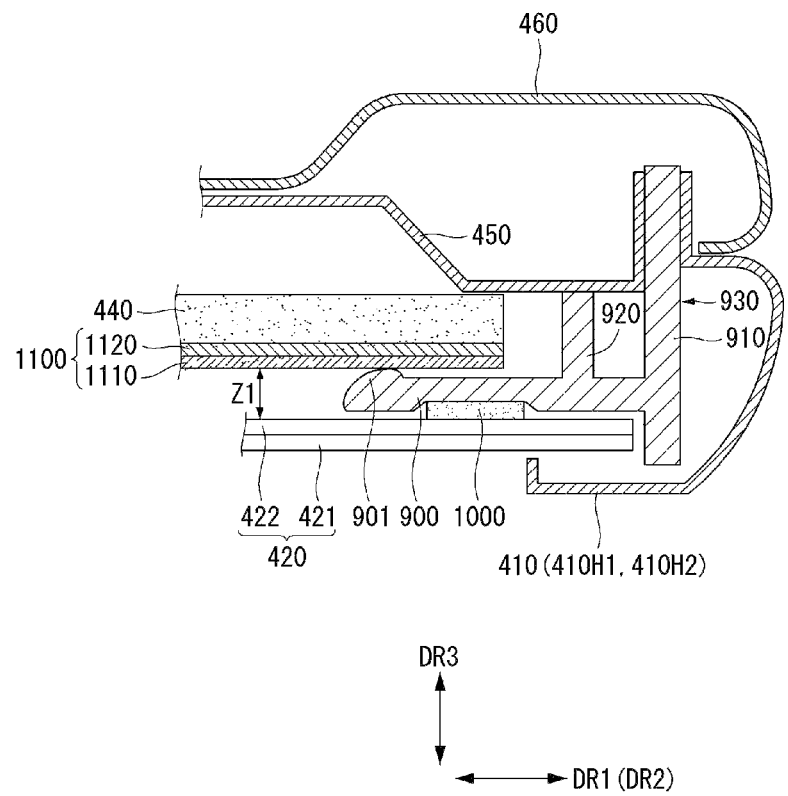

As shown in FIG. 24, the back cabinet 460 may be disposed in the rear of the back cover 450, and the top case 410 covering the edge of the front surface of the display panel 420 may be disposed. The top case 410 may cover the side wall 910 of the guide panel 430 on the side of the display device 100.

Figure 25:
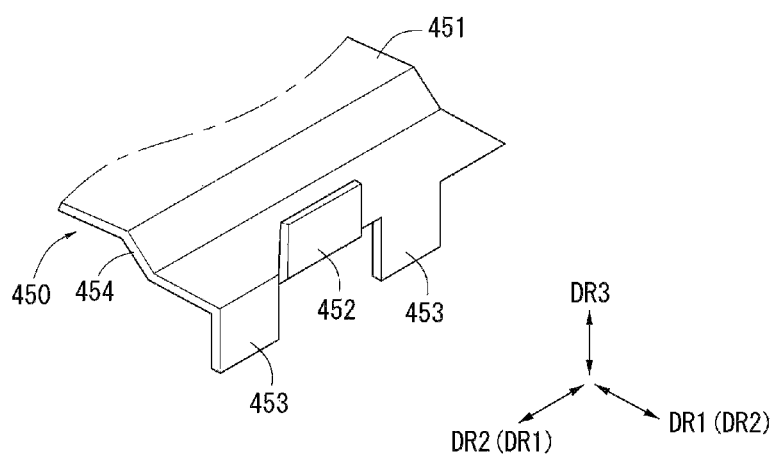

As shown in FIG. 25, the back cover 450 may include a horizontal frame part 451 extending in the horizontal direction (i.e., the first direction DR1 and/or the second direction DR2) and an inclined part 454 which extends from the horizontal frame part 451 in an oblique direction. Further, the back cover 450 may include an upward part 452 protruding backwards from an end of the back cover 450 in the vertical direction (i.e., the third direction DR3) and a downward part 453 protruding forward from the end of the back cover 450 in the vertical direction (i.e., the third direction DR3).

Figure 26:
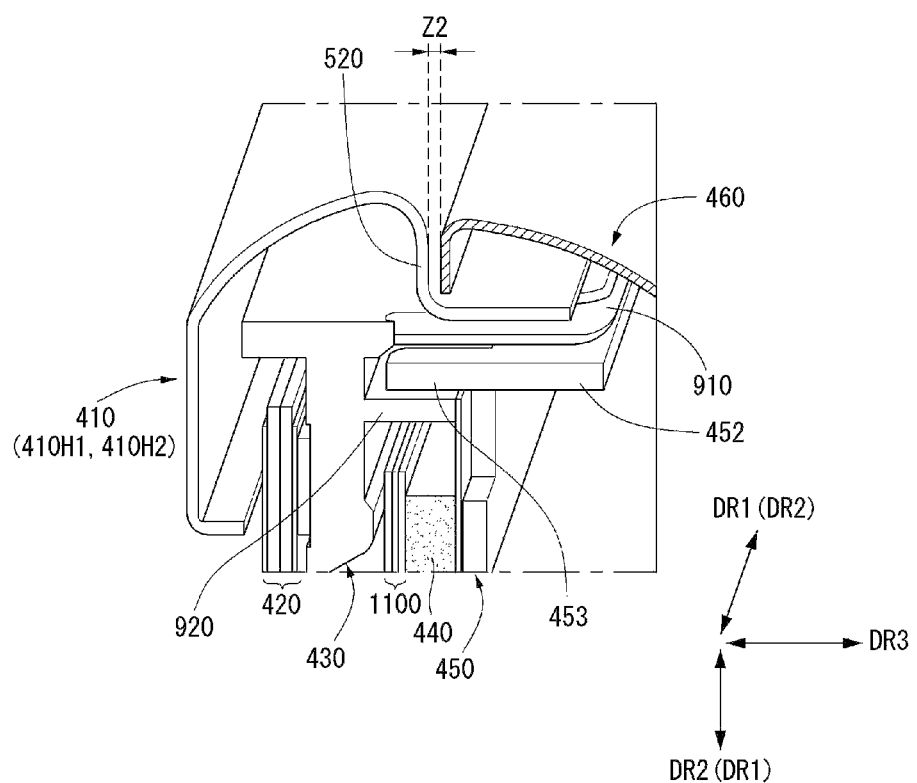

As shown in FIG. 26, the downward part 453 may be disposed between the side wall 910 and the inner wall 920 of the guide panel 430. The top case 410 may be separated from an end of the back cabinet 460 by a predetermined distance Z2 in the vertical direction (i.e., the third direction DR3) in a state where the top case 410 and the back cabinet 460 are installed. For example, the third parts 520 of the horizontal top cases 410H1 and 410H2 may be separated from the end of the back cabinet 460 by the predetermined distance Z2 in the vertical direction (i.e., the third direction DR3).

Figure 27:
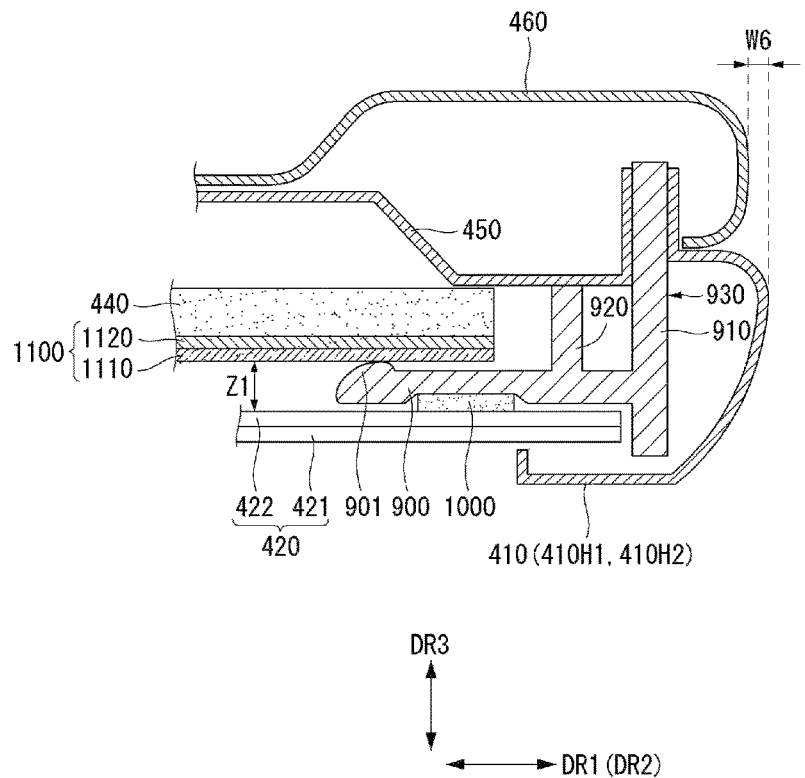

As shown in FIG. 27, at least one of the horizontal top cases 410H1 and 410H2 and the vertical top cases 410V1 and 410V2 may extend further than the back cabinet 460 by a predetermined length W6 in the horizontal direction (i.e., the first direction DR1 and/or the second direction DR2). The back cabinet 460 may be connected to the back cover 450.

Figure 28:
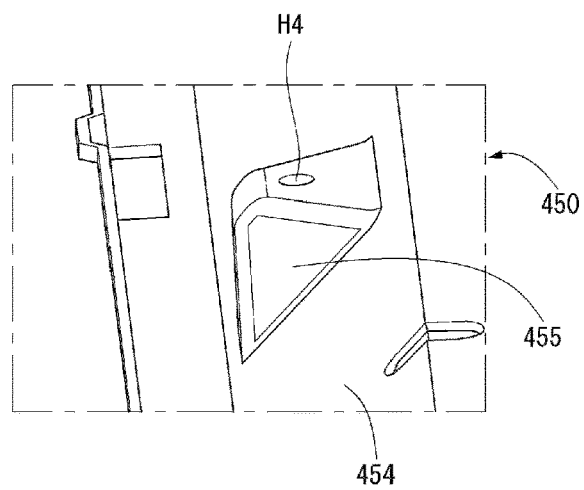

For this, as shown in FIG. 28, the back cover 450 may include a supporter 455 protruding toward the back cabinet 460. The supporter 455 may have a fourth hole H4. The supporter 455 may be formed on the inclined part 454 of the back cover 450.

Figure 29:
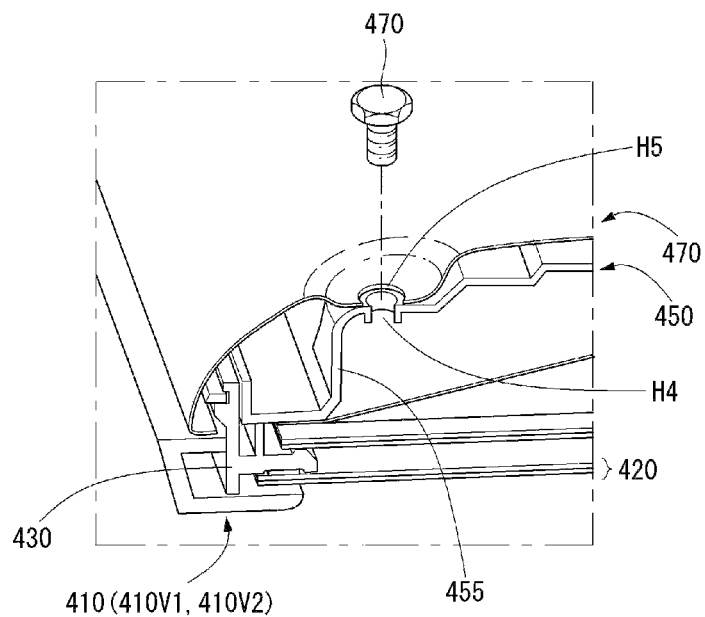

As shown in FIG. 29, the back cabinet 460 may have a fifth hole H5 corresponding to the fourth hole H4. A fastening member 470, such as a screw, may pass through the fifth hole H5 and the fourth hole H4 and may fasten the back cabinet 460 to the back cover 450.

As described above, when the back cover 450 includes the supporter 455 protruding toward the back cabinet 460 and the back cabinet 460 is fastened to the back cover 450 using the supporter 455, a fastening position between the back cover 450 and the back cabinet 460 may approach the outside of the display device. Hence, an increase in a thickness of the display device resulting from the fastening between the back cover 450 and the back cabinet 460 while more strongly fastening the back cabinet 460 to the back cover 450 may be suppressed.

Figure 30:
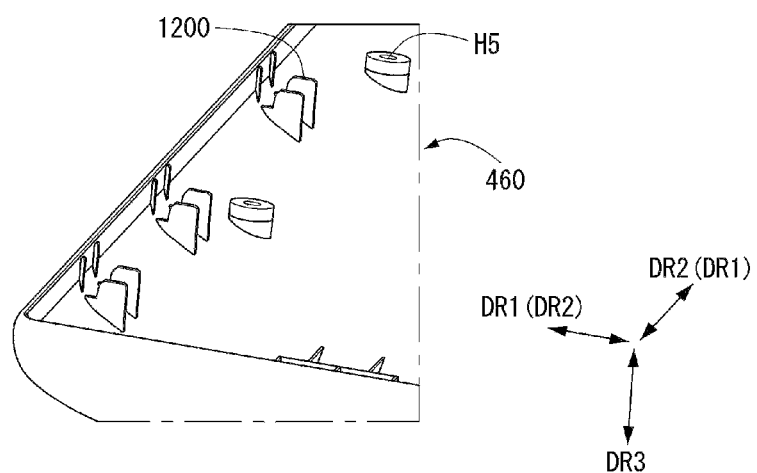

As shown in FIG. 30, a protrusion 1200 may be formed at an edge of the back cabinet 460 to maintain a distance between the end of the back cabinet 460 and the end of the back cover 450. The protrusion 1200 of the back cabinet 460 may protrude from an inner surface of the back cabinet 460 toward the back cover 450 in the vertical direction (i.e., the third direction DR3).

Figure 31:
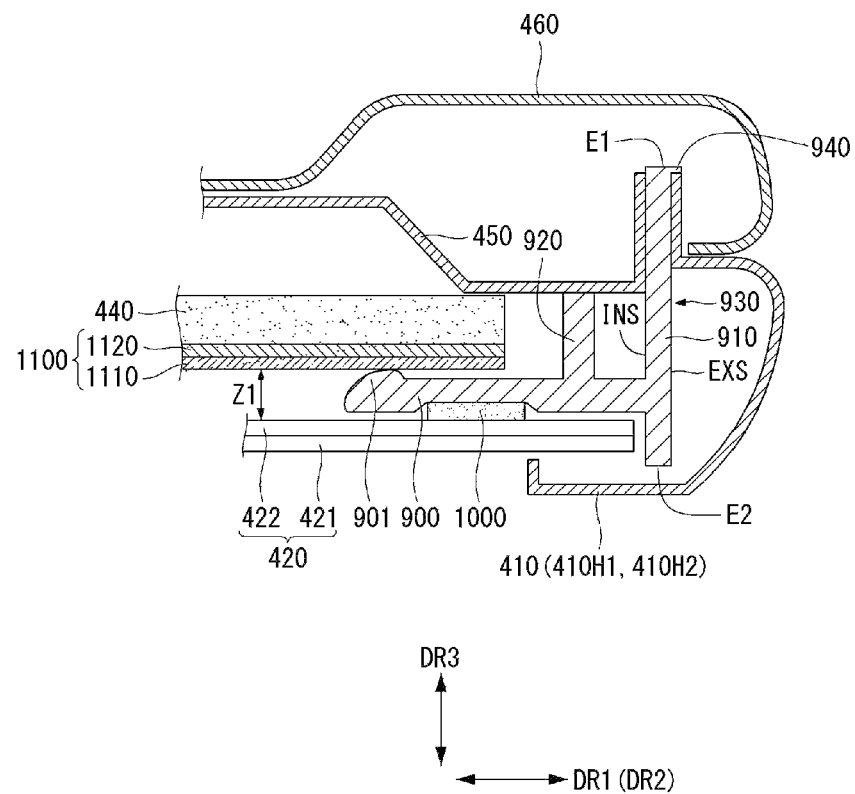

As shown in FIG. 31, the guide panel 430 may include a hanging part 940 extending from the external surface EXS of the first end E1 of the side wall 910 in the horizontal direction (i.e., the first direction DR1 and/or the second direction DR2). An end of the top case 410 may hang on the hanging part 940 of the guide panel 430.

Figure 32:
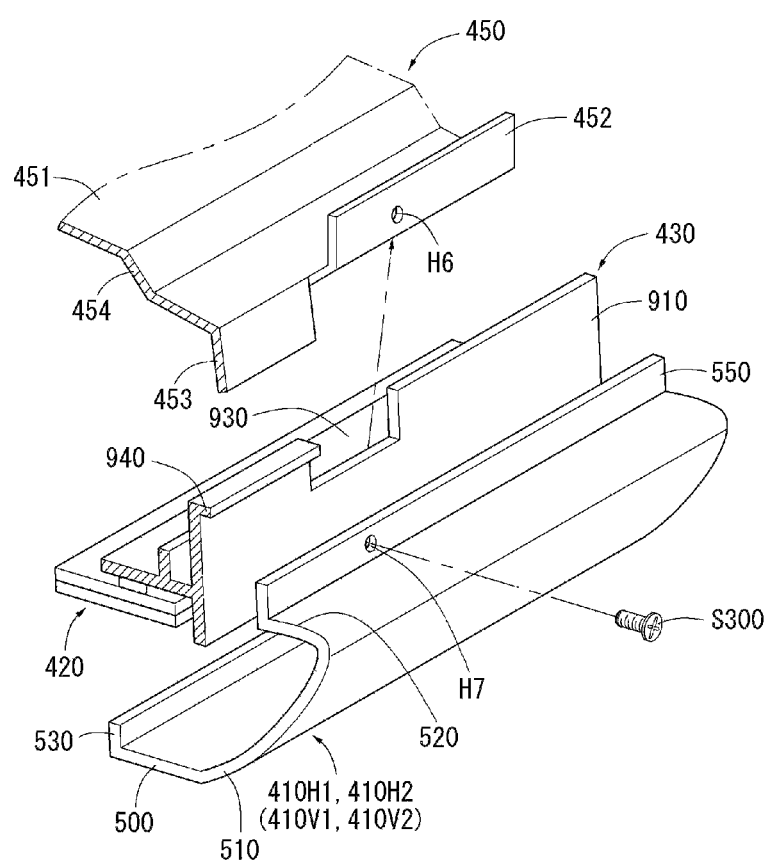

As shown in FIG. 32, the top case 410 may be connected to the back cover 450. For this, the sixth part 550 of each of the horizontal top cases 410H1 and 410H2 may have a seventh hole H7, and the back cover 450 may have a sixth hole H6 corresponding to the seventh hole H7. For example, the upward part 452 of the back cover 450 may have the sixth hole H6.

Figure 33:
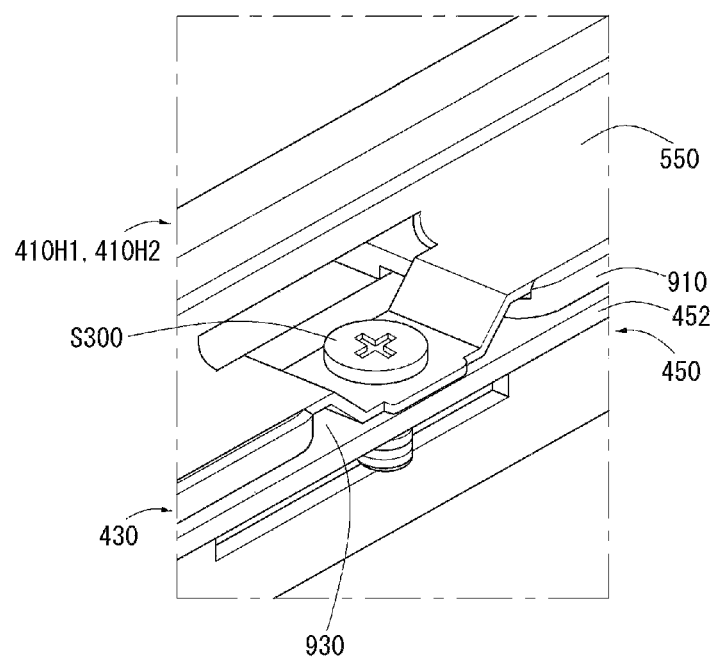

A predetermined third fastening member S300 may pass through the seventh hole H7 and the sixth hole H6 and may fasten the horizontal top cases 410H1 and 410H2 to the back cover 450. More specifically, as shown in FIG. 33, the third fastening member S300 may fasten the horizontal top cases 410H1 and 410H2 to the back cover 450 through the path 930 of the side wall 910 of the guide panel 430.

Figure 34:
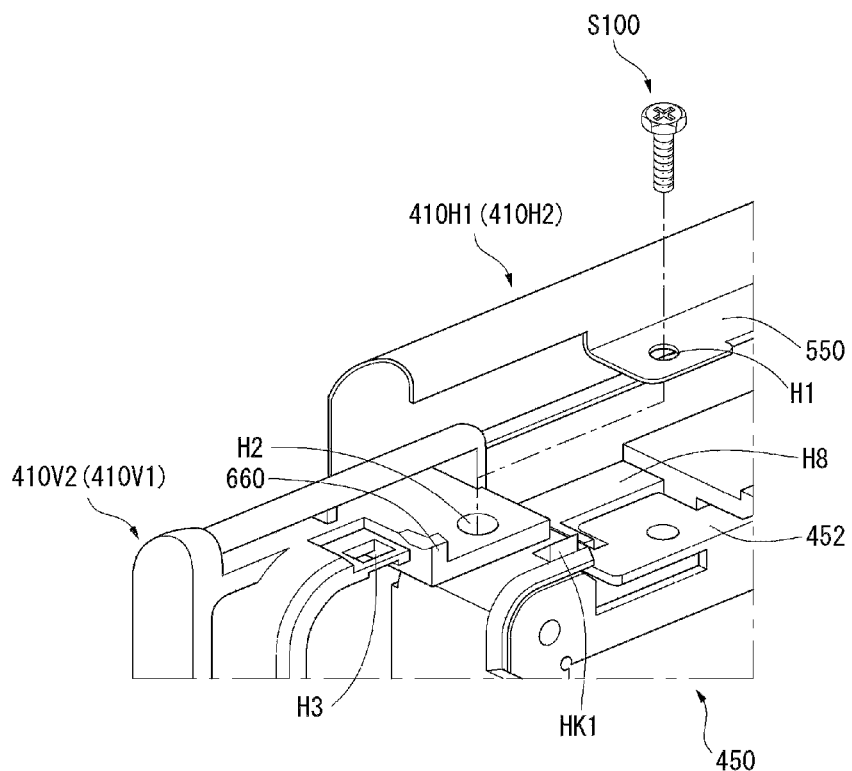

The horizontal top cases 410H1 and 410H2, the vertical top cases 410V1 and 410V2, and the back cover 450 may be connected to one another. For this, as shown in FIG. 34, the back cover 450 may have an eighth hole H8. For example, the upward part 452 of the back cover 450 may have the eighth hole H8. The first fastening member S100 may pass through the first holes H1 of the horizontal top cases 410H1 and 410H2, the second holes H2 of the vertical top cases 410V1 and 410V2, and the eighth hole H8 of the back cover 450 and may fasten the horizontal top cases 410H1 and 410H2, the vertical top cases 410V1 and 410V2, and the back cover 450.

Figure 35:
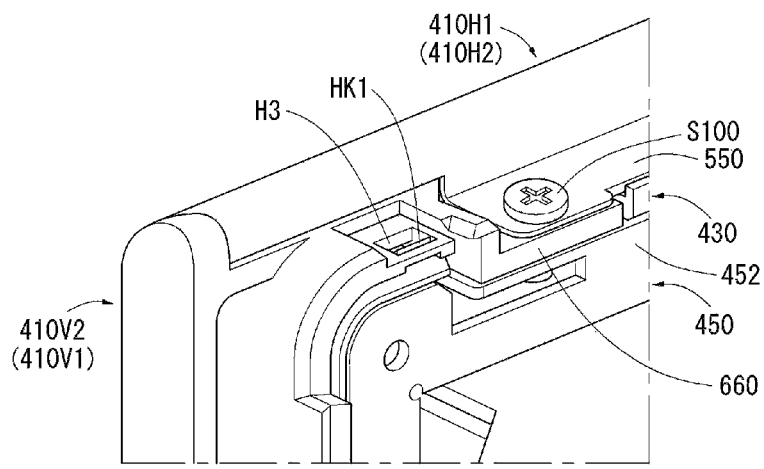

It can be seen from FIG. 35 that the horizontal top cases 410H1 and 410H2, the vertical top cases 410V1 and 410V2, and the back cover 450 may be fastened by the first fastening member S100.

Figure 36:
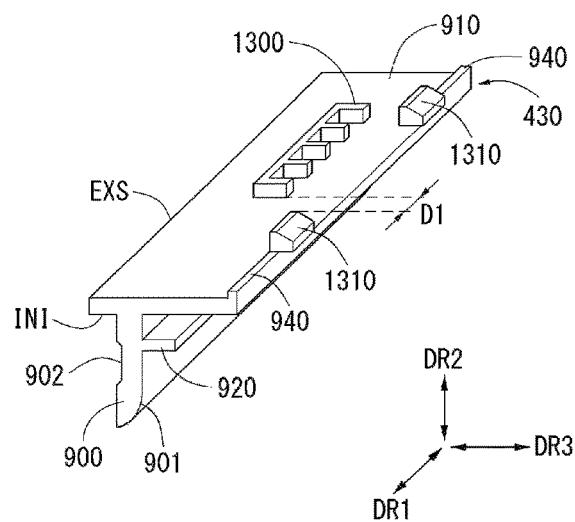

As shown in FIG. 36, the guide panel 430 may include protrusions 1300 and 1310 extending from the side wall 910 in the horizontal direction (i.e., the first direction DR1 and/or the second direction DR2). More specifically, the protrusions 1300 and 1310 may extend from the external surface EXS of the side wall 910 of the guide panel 430 in the horizontal direction (i.e., the first direction DR1 and/or the second direction DR2).

The protrusions 1300 and 1310 may include a first protrusion 1300 and a second protrusion 1310 which are separated from each other by a predetermined distance D1 in the direction parallel to the long side LS of the display panel 420, i.e., in the first direction DR1 of the horizontal direction (i.e., the first direction DR1 and/or the second direction DR2).

Figure 37:
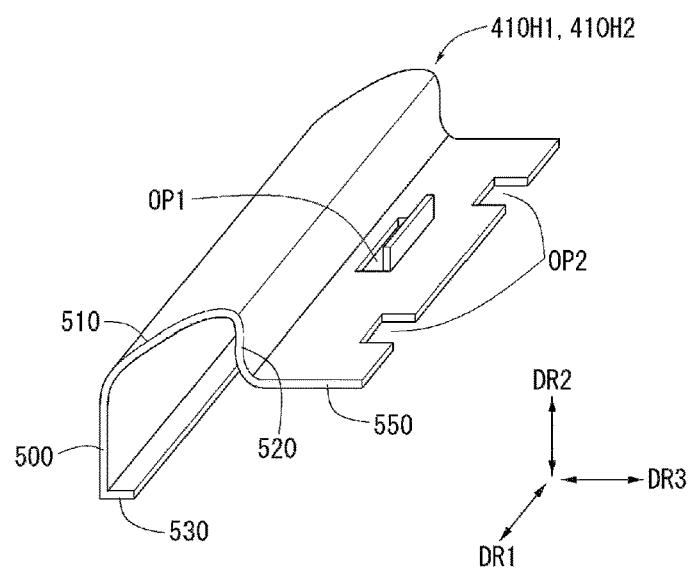
Figure 38:
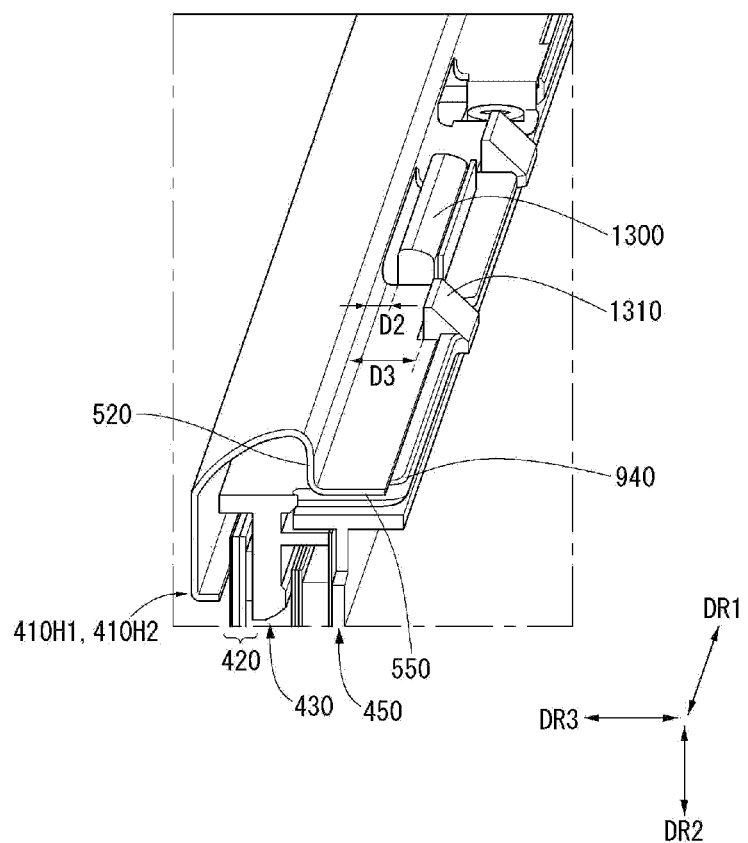

As shown in FIG. 37, the sixth part 550 of each of the horizontal top cases 410H1 and 410H2 may have a first opening OP1 corresponding to the first protrusion 1300 and a second opening OP2 corresponding to the second protrusion 1310. As shown in FIG. 38, the first protrusion 1300 of the guide panel 430 may be inserted into the first opening OP1 of each of the horizontal top cases 410H1 and 410H2, and the second protrusion 1310 of the guide panel 430 may be inserted into the second opening OP2.

A distance D2 between the third part 520 of each of the horizontal top cases 410H1 and 410H2 and the first protrusion 1300 in the vertical direction (i.e., the third direction DR3) may be different from a distance D3 between the third part 520 and the second protrusion 1310. Preferably, the distance D2 between the third part 520 of each of the horizontal top cases 410H1 and 410H2 and the first protrusion 1300 in the vertical direction (i.e., the third direction DR3) may be less than the distance D3 between the third part 520 and the second protrusion 1310. The end of the back cabinet 460 may be positioned between the third part 520 and the first protrusion 1300 or between the third part 520 and the second protrusion 1310.

Figure 39:
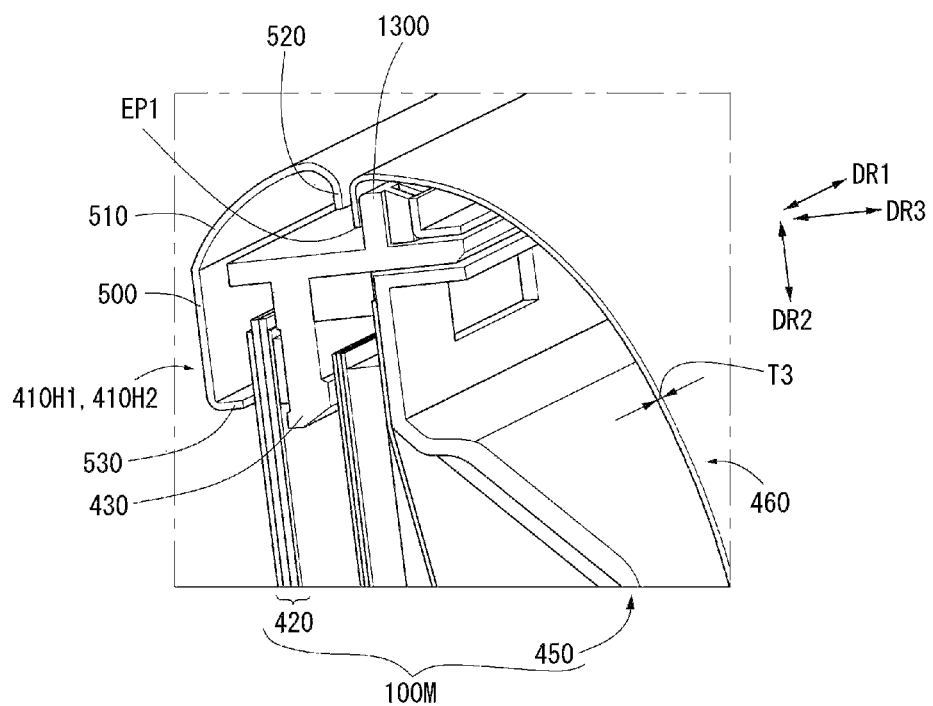

For example, as shown in FIG. 39, an end EP1 of the back cabinet 460 may be positioned between the third part 520 and the first protrusion 1300. In this instance, the wall thickness of the back cabinet 460 may be a third wall thickness T3 which is relatively small. For this, the end of the back cabinet 460 may at least contain a metal material.

When the back cabinet 460 is formed of the metal material, the back cabinet 460 may be manufactured using the press working method. Hence, the wall thickness T3 of the back cabinet 460 may be relatively small.

In other words, the end EP1 of the back cabinet 460 positioned in the rear of the display module 100M may hang on a protrusion extending from the side of the display module 100M in the horizontal direction (i.e., the first direction DR1 and/or the second direction DR2).

Figure 40:
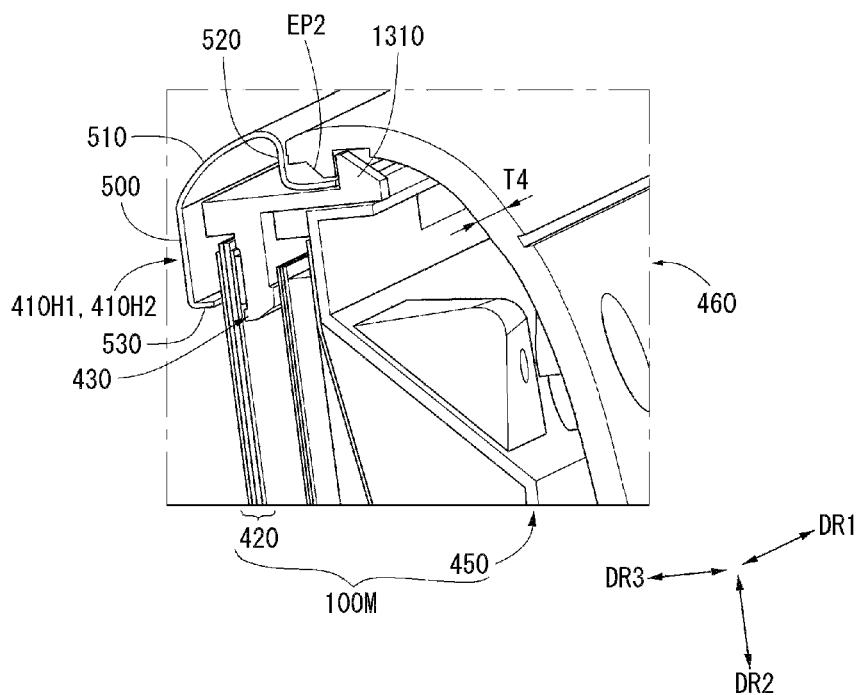
Figure 41:
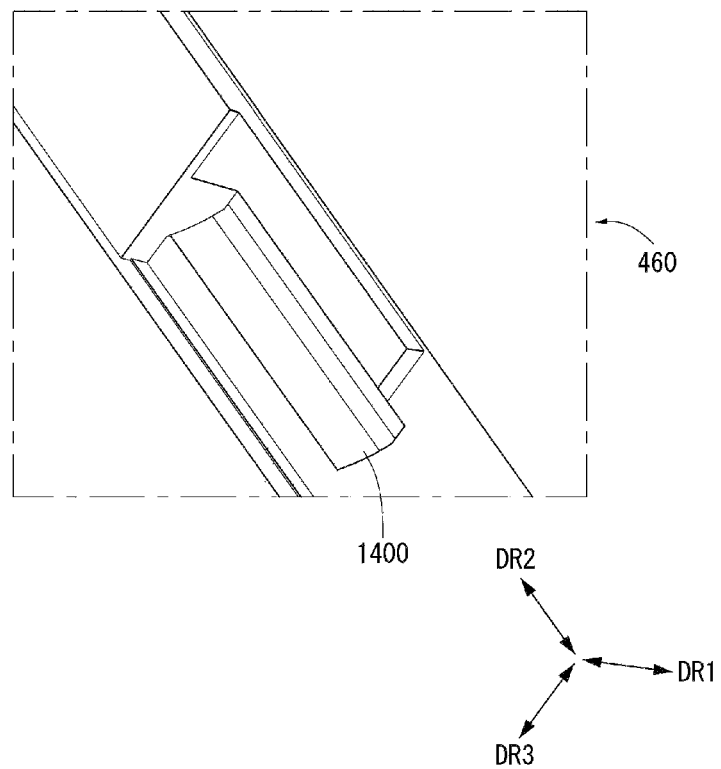

Alternatively, as shown in FIG. 40, an end EP2 of the back cabinet 460 may be positioned between the third part 520 and the second protrusion 1310. In this instance, the wall thickness of the back cabinet 460 may be a fourth wall thickness T4 greater than the third wall thickness T3. For this, the end of the back cabinet 460 may at least contain a plastic material.

When the back cabinet 460 is formed of the plastic material, the back cabinet 460 may be manufactured using the mold working method. Hence, the wall thickness T4 of the back cabinet 460 may be relatively large.

As described above, as shown in FIG. 41, it may be preferable, but not required, that the back cabinet 460 has another protrusion 1400 at its end, so as to insert the back cabinet 460 having the relatively large wall thickness T4 between the third part 520 and the second protrusion 1310. The protrusion 1400 may protrude from the end of the back cabinet 460 in the first direction DR1.

Figure 42:
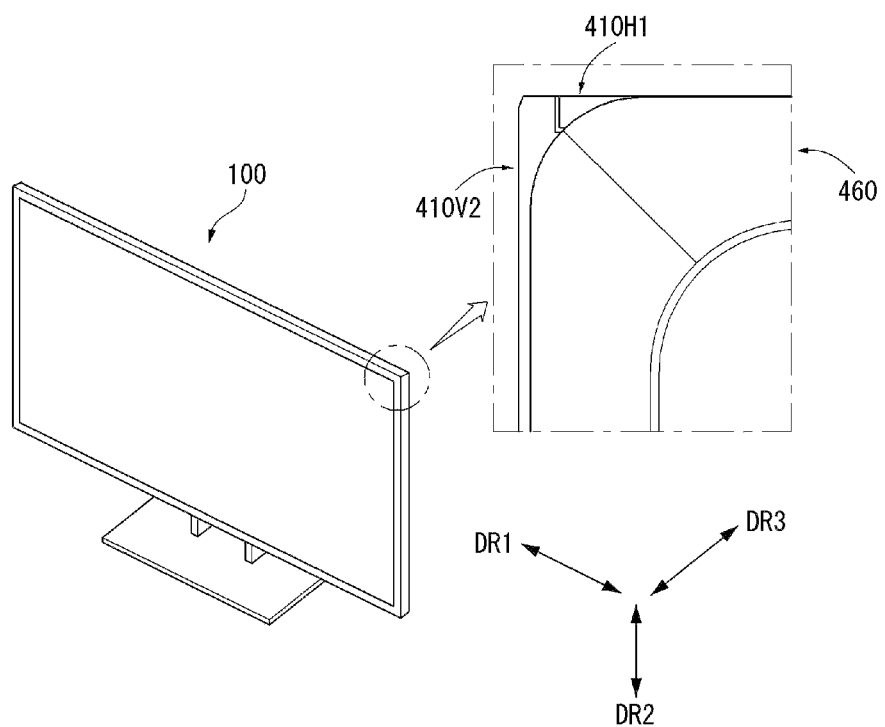

As shown in FIG. 42, in the rear of the display device 100 in a state where the back cabinet 460 and the top case 410 are coupled, at least one of the horizontal top cases 410H1 and 410H2 and the vertical top cases 410V1 and 410V2 may be exposed at the corner of the display device 100.

Figure 43:
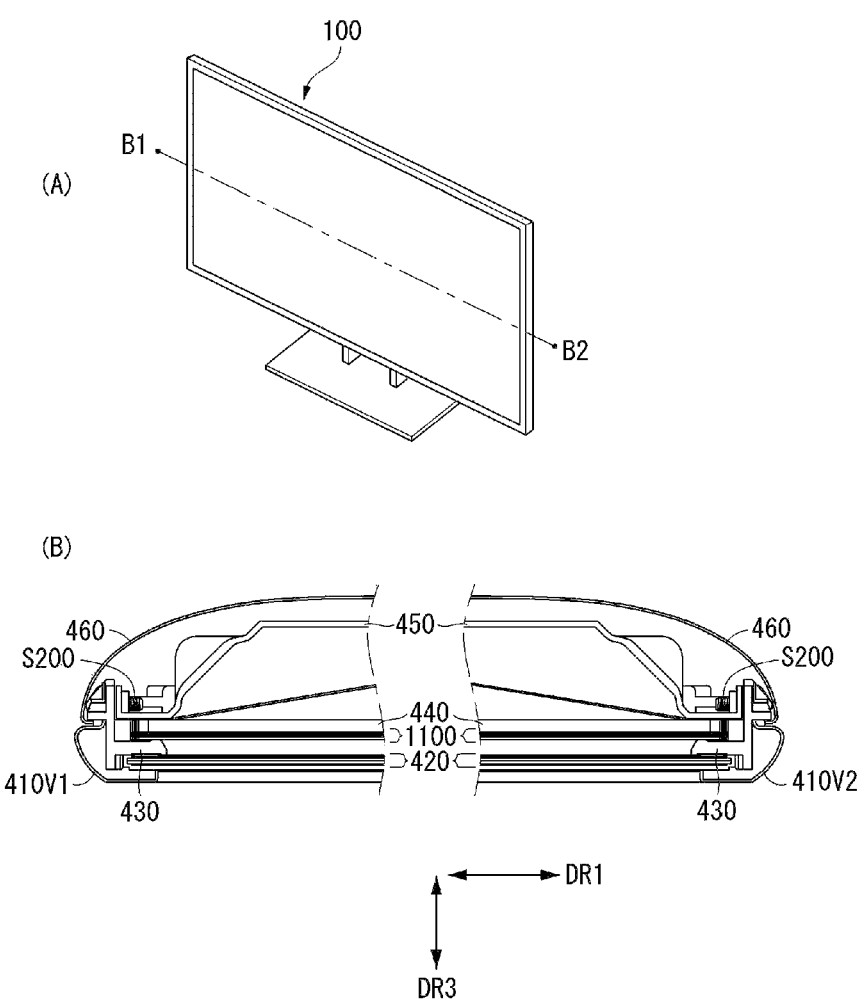

In FIG. 43, (B) is a cross-sectional view of the display device 100 taken along line B1-B2 of (A). Configuration shown in (B) of FIG. 43 was described in detail above.

Figure 44:
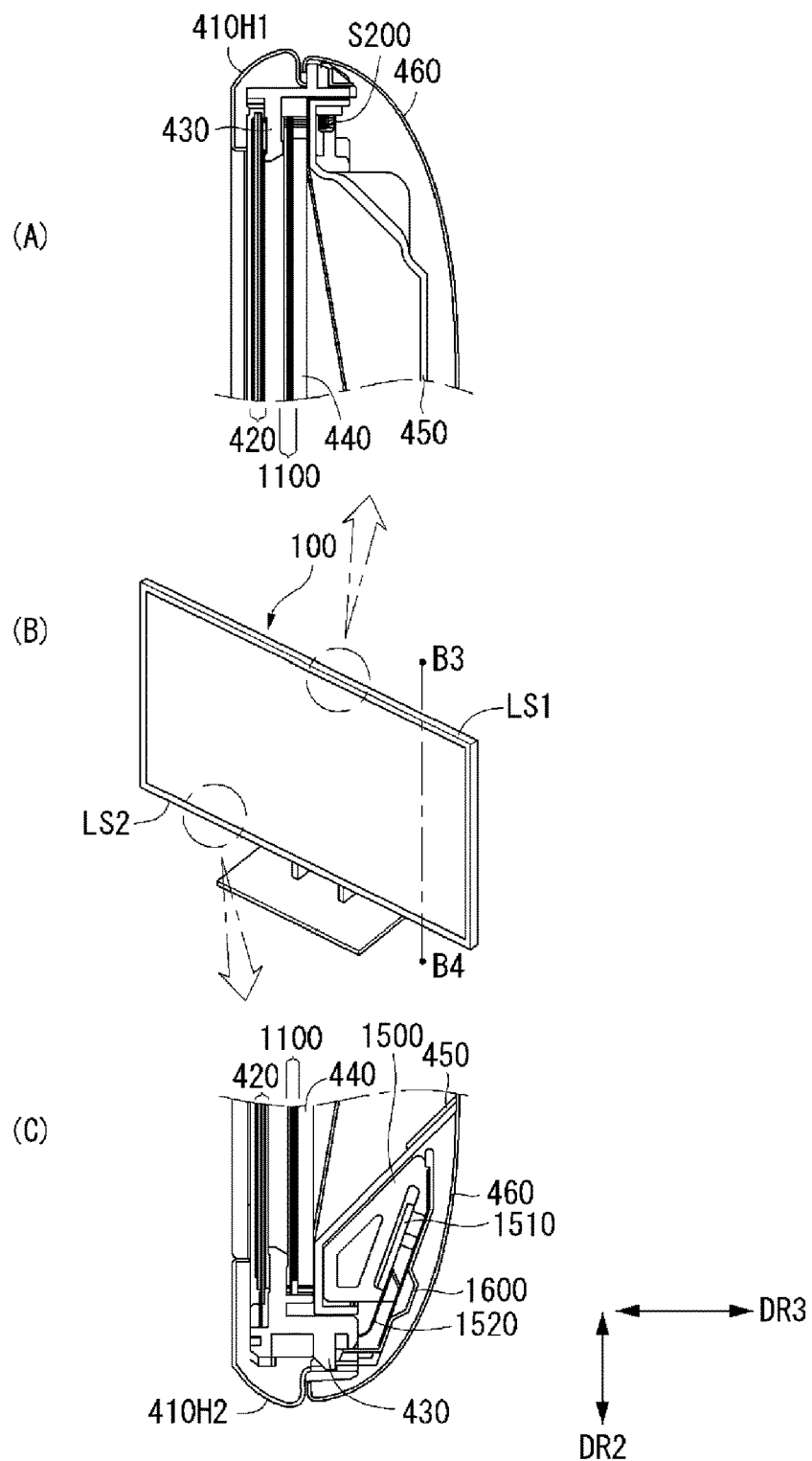

In FIG. 44, (A) is a cross-sectional view of the display device 100 taken along line B3-B4 of (B) on the first long side LS1 of the display device 100. Configuration shown in (A) of FIG. 44 was described in detail above.

Further, in FIG. 44, (C) is a cross-sectional view of the display device 100 taken along line B3-B4 of (B) on the second long side LS2 of the display device 100. As shown in (C) of FIG. 44, a structure 1500 for the support may be disposed between the back cover 450 and the back cabinet 460 on the second long side LS2 of the display device 100.

Further, a driving board (for example, a printed circuit board) 1510 and a flexible substrate 1520 may be disposed between the back cover 450 and the back cabinet 460 on the second long side LS2 of the display device 100. The flexible substrate 1520 may transmit a driving signal received from the driving board 1510 to the display panel 420. Further, a lower cover 1600 may be disposed between the back cover 450 and the back cabinet 460 on the second long side LS2 of the display device 100.

Figure 45:
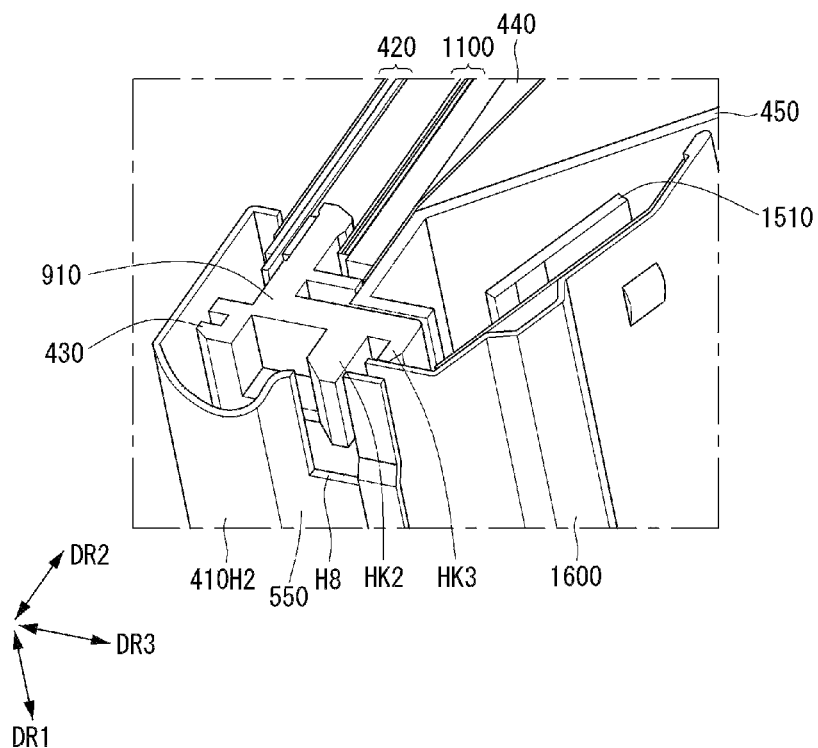

As shown in FIG. 45, one end of the lower cover 1600 may be disposed between the second horizontal top case and 410H2 and the guide panel 430. The sixth part 550 of the second horizontal top case and 410H2 may have an eighth hole H8.

The guide panel 430 may have a second hook HK2 inserted into the eighth hole H8 of the second horizontal top case and 410H2. The guide panel 430 may further have a third hook HK3 for firmly fixing the lower cover 1600 at an end of its side wall 910.

Figure 46:
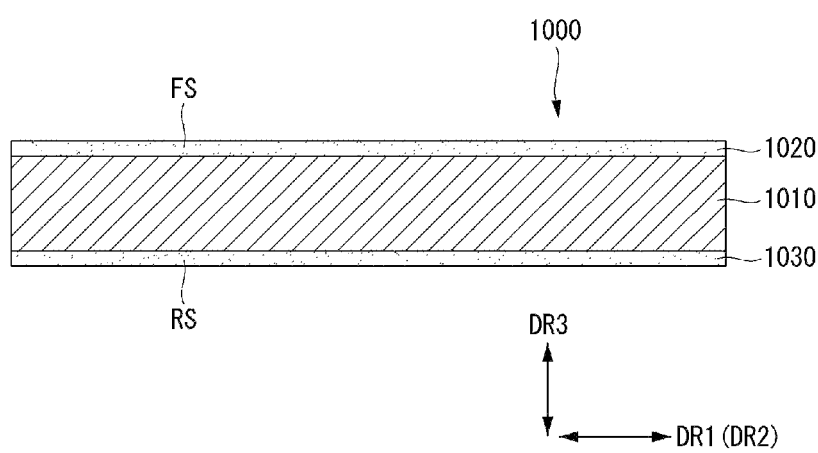

As shown in FIG. 46, the adhesive layer 1000 for attaching the guide panel 430 to the back surface of the display panel 420 may include a base layer 1010, a first layer 1020 which is formed on a first surface FS of the base layer 1010 and has the adhesion, and a second layer 1030 which is formed on a second surface RS of the base layer 1010 and has the adhesion.

It may be preferable, but not required, that the base layer 1010 may be formed of a material having elasticity. For example, the base layer 1010 may be formed of urethane foam.

The adhesive layer 1000 having the above-described configuration may have the elasticity and the flexibility as well as the adhesion. Hence, the adhesive layer 1000 may prevent an external force from being applied to the guide panel 430 and thus may prevent the external force from being transferred to the display panel 420. The adhesive layer 1000 having the above-described configuration may be referred to as a foam pad.

As broadly described and embodied herein, provided is an improved display device capable of reducing a material unnecessarily consumed. In one aspect, there is a display device which may include a display panel, a back cabinet disposed in the rear of the display panel, and a top case configured to cover an edge of a front surface of the display panel, wherein the top case includes a horizontal top case covering an edge of the front surface of the display panel on a long side of the display panel and a vertical top case covering an edge of the front surface of the display panel on a short side of the display panel, wherein the horizontal top case and the vertical top case are connected to each other on the corner of the display panel, wherein the horizontal top case and the vertical top case are formed of different materials.

The horizontal top case may contain a metal material, and the vertical top case may contain a plastic material. The horizontal top case may include a first part configured to extend in a horizontal direction, the first part including a portion covering the edge of the front surface of the display panel on the long side of the display panel, a second part configured to extend from a first end of the first part, the second part including a portion positioned on the side of the display panel on the long side of the display panel, and a third part configured to extend from an end of the second part in the horizontal direction.

The vertical top case may include a horizontal part configured to extend in the horizontal direction, the horizontal part including a portion covering the edge of the front surface of the display panel on the short side of the display panel, and a vertical part configured to extend from the horizontal part, the vertical part including a portion positioned on the side of the display panel on the short side of the display panel.

The horizontal top case may further include a fourth part which extends from a second end opposite the first end of the first part in a vertical direction and is positioned on the front surface of the display panel on the long side of the display panel, and a fifth part which extends from the fourth part in the horizontal direction and is covered by the horizontal part of the vertical top case.

The horizontal top case may further include a sixth part configured to extend from the third part in the vertical direction, and the sixth part of the horizontal top case may have a first hole, through which a fastening member passes.

The vertical part of the vertical top case may include an extension extending further than the horizontal part in the horizontal direction. The vertical top case may further include an overlap part which extends from the extension in the horizontal direction and is covered by the horizontal top case. The overlap part of the vertical top case may include a connection part which extends in the vertical direction and has a second hole corresponding to the first hole.

The display device may further comprise a back cover positioned between the back cabinet and the display panel. The back cabinet may be connected to the back cover. At least one of the horizontal top case and the vertical top case may extend further than the back cabinet in the horizontal direction.

The third part of the horizontal top case may be separated from the back cabinet by a predetermined distance in the vertical direction. Moreover, a paint or a tape may be applied to a surface of at least one of the horizontal part and the vertical part of the vertical top case.

As described above, the embodiments of the disclosure can reduce the material unnecessarily consumed and thus can reduce the manufacturing cost of the display device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
a display panel having a long side in a first direction, a short side in a second direction, and a thickness in a third direction;
a back cabinet disposed at a rear of the display panel; and
a case that covers at least two sides of the display panel, wherein the case includes a horizontal case that covers a side of the display panel on the long side of the display panel and a vertical case that covers a side of the display panel on the short side of the display panel,
wherein the horizontal case and the vertical case are coupled to each other in a region corresponding to a corner of the display panel,
wherein the horizontal case includes:
a horizontal side part extended in the third direction, the horizontal side part including a portion covering the side of the display panel on the long side of the display panel; and
a horizontal back part extended from an end of the horizontal side part in the second direction,
wherein the vertical case includes:
a vertical side part extended in the third direction, the vertical side part of the vertical case including a portion that covers the side of the display panel on the short side of the display panel;
a vertical back part extended from an end of the vertical side part of the vertical case in the first direction, and
a protrusion extended from the vertical side part of the vertical case in the first direction and coupled to the horizontal case.

2. The display device of claim 1, wherein the horizontal case further includes a first hole to accommodate a fastening member and the first hole is positioned adjacent to the protrusion of the vertical case.

3. The display device of claim 2, wherein the protrusion includes a connection part that extends in the third direction and has a second hole corresponding to the first hole on the horizontal case.

4. The display device of claim 3, wherein the display device further comprises a back cover provided between the back cabinet and the display panel,
wherein the back cabinet is coupled to the back cover.

5. The display device of claim 4, wherein at least one of the horizontal case and the vertical case extends further than the back cabinet in the first or second directions.

6. The display device of claim 1, wherein the horizontal back part of the horizontal case is separated from the back cabinet by a predetermined distance in the third direction.

7. The display device of claim 1, wherein the vertical case further includes an extension extended from the vertical side part of the vertical case in the second direction,
wherein the protrusion extends from the extension in the first direction.

8. The display device of claim 7, wherein the extension of the vertical case is positioned adjacent to an end of the horizontal case.

9. The display device of claim 7, wherein the extension of the vertical case covers an end of the horizontal case.

10. The display device of claim 1, wherein the protrusion of the vertical case is inserted into the horizontal case.

11. The display device of claim 1, wherein the display device further comprises:
a back cover between the display panel and the back cabinet; and
a guide panel between the display panel and the back cover,
wherein a back surface of the display panel is supported by the guide panel.

12. The display device of claim 11, wherein a part of the guide panel is attached to the back surface of the display panel through an adhesive layer.

13. The display device of claim 11, wherein the display device further comprises:
a light guide panel between the display panel and the back cover; and
a optical layer between the display panel and the light guide panel.

14. The display device of claim 11, wherein the case is coupled to a part of the back cover by a fastening member.

15. The display device of claim 1, wherein the back cabinet covers at least a portion of the horizontal back part of the horizontal case or the vertical back part of the vertical case.

16. The display device of claim 11, wherein the back cabinet has a hole, and the back cabinet is coupled to the back cover by a fastening member passing through the hole.

17. A display device comprising:
a display panel;
a back cover behind the display panel; and
a front cover provided around a circumference of the display panel,
wherein the front cover includes a horizontal portion to cover a side along a width of the display panel and a vertical portion to cover a side along a height of the display panel, the horizontal portion and the vertical portion having prescribed shapes to couple to each other,
wherein the horizontal portion includes:
a lateral surface that extends along the width of the display panel to cover a side of the display panel, and
a rear surface that extends vertically from the lateral surface parallel to the back surface of the display panel,
wherein the vertical portion includes a protrusion extending horizontally from an end of the vertical portion into the horizontal portion, the protrusion having a hole, and
wherein the horizontal portion and the vertical portion are coupled each other through the hole.

18. The display device of claim 17, wherein the horizontal portion includes a first hole provided on the horizontal portion to correspond to a second hole for the vertical portion of the front cover,
wherein the second hole is the hole of the protrusion.

19. The display device of claim 18, wherein the first hole and the second hole are provided a prescribed distance horizontally from the vertical portion of the front cover.

20. The display device of claim 18, wherein the vertical portion includes:

a back surface that extends horizontally behind the display panel to cover an edge along the height of the display panel, and
a lateral surface that extends forward from the back surface of the vertical portion to cover a side of the display panel,
wherein a height of the lateral surface of the vertical portion is greater than a height of the back surface of the vertical portion,
wherein the protrusion extends farther than the back surface of the vertical portion, and
wherein the second hole is provided on the protrusion to correspond to the first hole provided on the horizontal portion, the horizontal portion and the vertical portion of the front case being coupled using a fastener provided through the first and second holes.

* * * * *